United States Patent [19]
Eyuboglu et al.

[11] Patent Number: 5,297,170
[45] Date of Patent: Mar. 22, 1994

[54] LATTICE AND TRELLIS-CODED QUANTIZATION

[75] Inventors: Vedat M. Eyuboglu, Boston; G. David Forney, Jr., Cambridge, both of Mass.

[73] Assignee: Codex Corporation, Mansfield, Mass.

[21] Appl. No.: 570,413

[22] Filed: Aug. 21, 1990

[51] Int. Cl.[5] .......................................... H04B 14/04
[52] U.S. Cl. ....................................... 375/25; 375/122
[58] Field of Search ................. 375/39, 122, 25, 34, 375/27; 341/200, 67, 26; 381/31; 358/133, 433

[56] References Cited

U.S. PATENT DOCUMENTS

| | | | |
|---|---|---|---|
| 4,558,350 | 12/1985 | Murakami | 358/21 R |
| 4,910,608 | 3/1990 | Whiteman et al. | 358/433 |
| 4,959,842 | 9/1990 | Forney et al. | 375/39 |
| 4,975,956 | 12/1990 | Liu et al. | 381/47 X |

OTHER PUBLICATIONS

Max, J., "Quantizing for Minimum Distortion", IRE Trans. Inform. Theory, 1960.
Linde, Buzo and Gray, "An Algorithm for Vector Quantizer Design", IEEE Trans. Communications, 1980.
Gersho, A., "Asymptotically Optimal Block Quantization", IEEE Trans. on Information Theory, 1972.
Conway and Sloane, "A Fast Encoding Method for Lattice Codes and Quantizers", IEEE Trans. Inform. Theory, 1983.
Buzo et al., "Speech Coding Based Upon Vector Quantization", IEEE Trans. ASSP, 1980.
Juang and Gray., "Multiple-Stage Vector Quantization for Speech Coding", Proc. of ICASSP, 1982.
Roucas, Schwartz and Makoul, "Segment Quantization for Very Low-Rate Speech Coding", Proc. ICASSP, 1982.
Kuhlman and Bucklew, "Piecewise Uniform Vector Quantizers", IEEE Trans. Inform. Theory, Sep. 1988.
Fischer, "A Pyramid Vector Quantizer", IEEE Trans. Inform. Theory, 1986.
Marcellin and Fischer, "Trellis-Coded Quantization of Memoryless and Gauss-Markov Sources", IEEE Trans. on Commun., 1990.
Forney and Wei., "Multi-dimensional Constellations—Part I: Introduction, Figures of Merit, and Generalized Cross Constellation", IEEE JSAC, 1989.
Forney, "Multi-dimensional Constellations—Part II: Voronoi Constellations", IEEE JSAC, 1989.
Forney et al., "Efficient Modulation for Band-Limited Channels", JSAC 1984.

*Primary Examiner*—Curtis Kuntz
*Assistant Examiner*—Tesfaldet Bocure
*Attorney, Agent, or Firm*—Fish & Richardson

[57] ABSTRACT

Vectors are quantized by representing the vectors by quantized values using a codebook having granular regions which are based on a coset code, and which lie inside a boundary region which is based on another coset code, the boundary region being other than an N-cube and other than the Voronoi region of a sublattice $\Lambda_b = M\Lambda_g$ of a lattice $\Lambda_g$ upon which the granular regions may have been based.

65 Claims, 7 Drawing Sheets

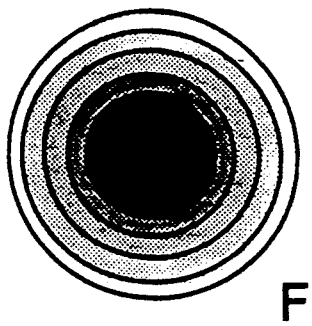
FIG. 14
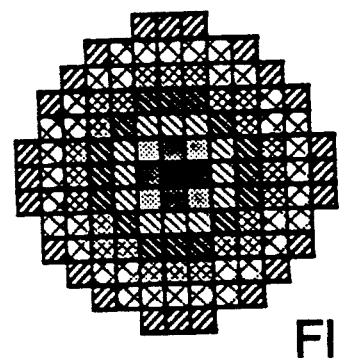
FIG. 15
■ 000 (1)
▦ 001x; 010x (4)
▨ 011xx (4)
▧ 100xxx;1010xx (12)
▧ 1011xxx;1100xxx (16)
▨ 1101xxxx;11100xxx (24)
▧ 11101xxxx; 11110xxxx; 1111100xx (36)
▨ 1111101xxx; 111111xxxx (24)
FIG. 16
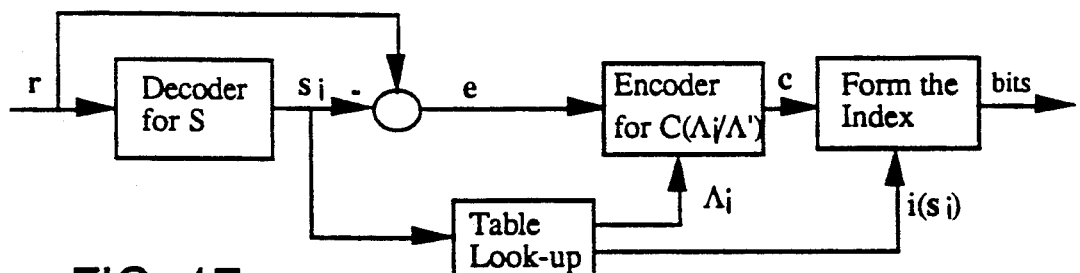
FIG. 17
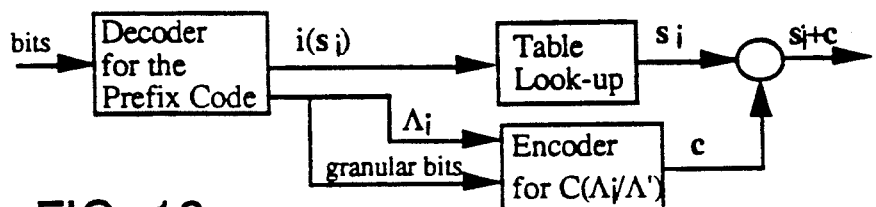
FIG. 18

LATTICE AND TRELLIS-CODED QUANTIZATION

BACKGROUND OF THE INVENTION

This invention relates to quantization.

Quantization is the process of approximating a sequence of continuous-amplitude samples by a quantized sequence that can be represented by a finite-rate digital data sequence (e.g., a bit sequence) for purposes of digital transmission or storage. The primary performance criteria in quantization are the average distortion between the original signal and the quantized sequence, and the average number R of bits used to represent each sample (the bit rate).

Scalar quantization is the simplest form of quantization. In scalar quantization, successive samples are quantized independently. In a uniform scalar quantizer, the discrete quantization levels are uniformly spaced along the real line. For a source characterized by a uniform probability distribution, the uniform scalar quantizer is the optimum scalar quantizer. But for a source with a nonuniform distribution, a nonuniform scalar quantizer can produce lower distortion by allocating more quantization levels to regions where the source samples are more likely to fall. A nonuniform scalar quantizer can perform significantly better than a uniform scalar quantizer, particularly at high rates and for sources whose probability distributions exhibit long tails. Optimum nonuniform scalar quantizers can be determined using a well-known iterative algorithm, described by J. Max in "Quantizing for Minimum Distortion", IRE Trans. Inform. Theory, 1960.

Even the best nonuniform scalar quantizer usually falls short of the best possible performance, called the rate-distortion limit described by T. Berger in "Rate Distortion Theory", Prentice Hall, 1971. In order to close this gap, multiple source samples must be quantized jointly; this is called vector quantization.

An N-dimensional, rate-R vector quantizer uses a codebook with $2^{NR}$ quantization levels or codewords in N-space. Optimum codebooks must satisfy so-called Voronoi and centroid conditions. These necessary conditions can be used in iterative design algorithms (e.g., the K-means algorithm) to generate codebooks from training sequences as described by Linde, Buzo and Gray in "An Algorithm for Vector Quantizer Design", IEEE Trans. Communications, 1980. Such codebooks have local optimality properties, but they usually lack structure, and therefore their computational and storage complexities both grow exponentially with the rate R and dimensionality N.

A lattice quantizer uses a codebook whose codewords are the vectors from an N-dimensional lattice that lie within some region of N-space, called the boundary region. A lattice quantizer uses a minimum-distance decoding algorithm that finds the lattice vector that is closest to the source vector. Efficient decoding algorithms are known for many good N-dimensional lattices.

However, according to asymptotic quantization theory (A. Gersho, "Asymptotically optimal block quantization", IEEE Trans. on Information Theory, 1972), to reach the minimum achievable distortion at fixed dimensionality and asymptotically increasing rate, it is essential to use codebooks whose codeword density is approximately proportional to the source probability distribution. However, for lattice quantizers, the distribution of code sequences is more or less uniform within the boundary region. (For example, a uniform scalar quantizer is a one-dimensional lattice quantizer which is strictly inferior compared to the optimum scalar quantizer.) In higher dimensions this suboptimality tends to disappear because of the effect of the law of large numbers; for example, for memoryless Gaussian sources, 'sphere-hardening' causes the source distribution to be approximately uniform over a sphere, in which case a lattice quantizer bounded by a sphere becomes approximately optimum. But if complexity considerations necessitate the use of lower dimensionality, lattice quantization techniques need to be modified if performance near the asymptotic quantization theory bounds is to be achieved.

Known application of lattices to quantization has been limited to memoryless sources with uniform distributions. In that special case the optimum boundary region is an N-cube, and it is not necessary to store the codewords. For nonuniform sources, however, lattice quantizers have not been widely used, because if optimum codebook boundaries are to be employed (e.g., spheres in the case of Gaussian sources), it becomes necessary to store all the codewords.

A method due to Conway and Sloane "A fast encoding method for lattices and quantizers", IEEE, Trans. Inform. Theory, 1983, addresses this problem, at the expense of increased computational complexity, by using the Voronoi region of a large-scale integer-multiple of the lattice as the boundary region. The resulting codebook is called a Voronoi code. The code sequences need not be stored; rather, there is a mapping algorithm that involves a decoding of the large-scale lattice. The Conway and Sloane method is limited to Voronoi regions that are scaled integer multiples of the granular quantization cell. More generally, while Voronoi regions can be good choices as boundary regions for memoryless Gaussian sources, they may not be appropriate for non-Gaussian sources.

Other types of structured codebooks have also been proposed for vector quantization in order to reduce implementation complexity.

In so-called binary tree-searched vector quantization, (Buzo, et al., "Speech coding based upon vector quantization", IEEE Trans. ASSP, 1980), the codebook is constructed with a tree of NR stages; the i'th stage defines a pseudo-codebook with $2^i$ codewords and the last (NRth) stage represents the true codebook. Starting at the initial node of the tree, the tree-structured quantizer operates on the source vector in a stage-by-stage fashion by selecting the pseudo-codewords that minimize the distortion; it refines its decisions as it moves along the tree, until the true codeword is specified in the final stage. In this method the quantizing complexity is proportional to the rate-dimension product NR rather than to $2^{NR}$. Also, the performance of this method is usually close to that of full-search unstructured vector quantization. Unfortunately, its storage complexity is even worse than that of full-search vector quantization, because of the need to store the pseudo-codebooks, and this limits its practical application.

There are alternative structures that can reduce the computational as well as the storage complexity, but at the expense of increased distortion. One of these structures is called a multi-stage vector quantizer (Juang and Gray, Jr., "Multiple-stage vector quantization for speech coding", Proc. of ICASSP, 1982). In the simplest case of two stages, a multi-stage vector quantizer consists of a coarse quantizer of rate $R_1$ and a granular quantizer of rate $R_2$, typically both if dimensionality N, such that $R_1+R_2=R$. The source vector is first quantized by the coarse quantizer, and the resulting residual (quantization error) is then quantized by the granular quantizer. The sum of the outputs of the coarse and granular quantizers is the codeword. In a two-stage quantizer, the computational and storage complexities are both proportional to $2^{NR_1}+2^{NR_2}$, which can be substantially smaller than $2^{NR}$. However, performance is typically not very good, for two reasons: a.) depending on the quantization level chosen by the coarse quantizer, the residuals can exhibit different statistics, which cannot be effectively quantized by a fixed granular quantizer; b.) different quantization levels of the coarse quantizer have different probabilities, so a variable-rate granular quantizer is necessary to exploit these variations.

A way to alleviate the first factor is to transform the residuals by a linear transformation that depends on the quantization level chosen by the coarse quantizer, at the expense of increased storage and computational complexity (Roucos, Schwartz and Makhoul "Segment quantization for very low-rate speech coding", Proc. ICASSP, 1982.)

A seemingly different quantization method known as piecewise uniform quantization can also be viewed as a form of multi-stage vector quantization (Kuhlman and Bucklew, "Piecewise uniform vector quantizers", IEEE Trans. Inform. Theory, Sept.. 1988, and Swaszek, "Unrestricted multi-stage vector quantizers" Inform. Theory Symposium, 1990), that can alleviate the second problem. A piecewise uniform quantizer is a two-stage vector quantizer in which the granular quantizer is a lattice quantizer, with a rate that is varied based on the output of the coarse quantizer. The implementation complexity of the granular quantizer is determined by the decoding complexity of the underlying lattice, and its codewords need not be stored, provided that the coarse quantizer has quantization regions that can be characterized as N-cubes.

Piecewise uniform quantization is effective when the rate and/or the dimensionality is high, so that within any coarse quantization region the residuals are approximately uniformly distributed. Then these residuals can be effectively quantized with a uniform quantizer whose points are chosen from a lattice and whose codebook boundary is an N-cube. But since the granular quantizer has variable rate, implementing piecewise uniform quantizers requires novel mapping rules for addressing codewords in a way that produces a constant bit rate. Also, sometimes it may be desirable to implement piecewise uniform quantizers with coarse quantizers whose decision regions are not simple N-cubes.

Another method for reducing the computational and storage complexities of full-search vector quantizers is product quantization. In this method, the input vector is written as the product of two components of dimensionality $N_1$ and $N_2$, and these are quantized at rates $R_1$ and $R_2$, either independently or sequentially.

An interesting form of product quantization is spherical vector quantization, where the norm of the source vector is quantized with a first quantizer (typically, scalar) and the orientation of the source vector is quantized with a second quantizer whose codewords lie on the surface of an N-sphere (Adoul and Barth, "Nearest Neighbor Algorithm for Spherical Codes from the Leech Lattice", IEEE, Trans. Inform. Theory, 1988). The encoding complexity of the spherical quantizer is simplified by observing that its codewords can be generated as permutations of a small number of so-called class leaders. Quantizing can be performed by first permuting the source vector so that its components are in descending order, and then computing the distortions only to the class leaders. Spherical quantization is practical for low-rate encoding of Gaussian sources. A similar technique, known as pyramid quantization, has been developed for Laplacian sources, Fischer, "A pyramid vector quantizer", IEEE Trans. Inform. Theory, 1986.

In a method called trellis-coded quantization (TCQ), (Marcellin and Fischer, "Trellis-coded quantization of memoryless and Gauss-Markov sources", IEEE. Trans. on Commun., 1990), the codewords are sequences chosen from a trellis code. In the simplest one-dimensional case, the trellis code is constructed from a scalar nonuniform quantizer with an expanded number of levels partitioned into subsets. A convolutional code specifies the code sequences, and a Viterbi algorithm decoder is used to select the code sequence that best matches the input sequence. By increasing the complexity of the trellis code, TCQ can provide good performance for uniform or Gaussian sources. For sources whose probability distributions exhibit long tails, alternative methods are necessary to improve the performance. This latter limitation of TCQ is due to the fact that it scales its granular regions based on the one-dimensional source probability distribution rather than multi-dimensional joint probability distributions, as would be required by the asymptotic quantization theory.

SUMMARY OF THE INVENTION

In general, in one aspect, the invention features quantizing vectors by representing the vectors by quantized values using a codebook having granular regions which are based on a coset code, and which lie inside a boundary region which is based on another coset code, the boundary region being other than an N-cube and other than the Voronoi region of a sublattice $\Lambda_b=M\Lambda_g$ of a lattice $\Lambda_g$ upon which the granular regions may have been based.

Preferred embodiments include the following features. In some embodiments, the granular regions are based on a lattice $\Lambda_g$, or a translate $\Lambda_g+a$; in others, the granular regions are based on a trellis code or a translate of a trellis code. In some embodiments, the boundary region is based on a lattice, in others on a trellis code. The granular regions are fundamental (e.g., Voronoi) regions of a lattice $\Lambda_g$ or its translate, or of a trellis code or a translate of a trellis code. The boundary region is a fundamental (e.g., Voronoi) region of a lattice $\Lambda_b$, or of a trellis code. A quantizer selects one of the granular regions to represent each vector. The quantizer includes means for detecting an overload, e.g., a decoder for the coset code on which the boundary region is based to determine the overload.

Preferred embodiments also include the following features. Each granular region is represented by a coset leader of a sublattice $\Lambda_b$ in $\Lambda_g$ or a translate of $\Lambda_g$. A mapper represents the coset leader by bits. A reconstructor maps the bits into a coset representative, and translates the coset representative tot he coset leader using a decoder for the lattice $\Lambda_b$. The decoder is a minimum distance decoder for the lattice $\Lambda_b$. The mapping of bits to coset representatives includes a binary encoder $G_g$ for the lattice $\Lambda_g$ and an inverse syndrome former $(H_b^{-1})^T$ for the lattice $\Lambda_b$. A binary decoder $G_g$ for the lattice $\Lambda_g$ and a binary syndrome former $H_b^T$ for the lattice $\Lambda_b$ are used.

In general, in another aspect, the invention features quantizing vectors by representing the vectors by quantized values using a codebook having granular regions which are based on a coset code and which lie inside a boundary region which is based on a finite field code and a finite set of subregions, the boundary region being other than an N-cube and other than the Voronoi region of a sublattice $\Lambda_b = M\Lambda_g$ of a lattice $\Lambda_g$ upon which the granular regions may have been based.

Preferred embodiments include the following features. The mapper to bits extracts a label representing a sequence of subregions. The decoder uses granular and scaling bits in making a selection.

Preferred embodiments also include the following features. A quantizer selects one of the granular regions in the boundary region.

Preferred embodiments also include the following features. Multiple codebooks form a super codebook, at least two of the codebooks having granular regions with different volumes. One of the codebooks and one of the granular regions in the selected codebook represent the vector. At least two of the codebooks have granular regions with different volumes. A variable length prefix code represents the selected codebook so that a fixed number of bits can be used to represent the selected codebook and the granular region.

Other advantages and features will become apparent from the following description of the preferred embodiments and from the claims.

DESCRIPTION OF THE PREFERRED EMBODIMENT

We first briefly describe the drawings.

FIG. 14 is a diagram of spherical coarse cells for piecewise uniform quantization of Gaussian sources.

FIG. 15 is a diagram of spherical subregions made up of small square coarse cells.

FIG. 16 is a prefix code to represent coarse cells.

FIG. 17 is a block diagram of an encoder for non-uniform lattice quantization using lattice-structured coarse cells.

FIG. 18 is a block diagram of a decoder for non-uniform lattice quantization using lattice-structured coarse cells.

LATTICE QUANTIZATION

Lattice Quantization of Memoryless Sources

Definitions

Figure 1:
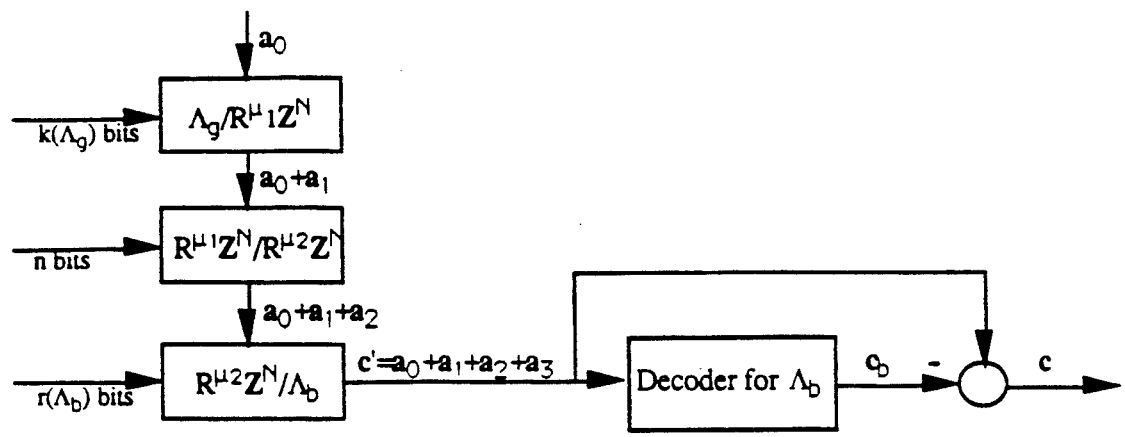
FIG. 1 is a block diagram of a reconstruction circuit for lattice codebooks with lattice-structured boundaries.

An N-dimensional lattice quantizer codebook $$C(\Lambda_g; \underline{R}_b) = \Lambda_g \cap \underline{R}_b$$

consists of the set of points (N-vectors) c from an N-dimensional lattice $\Lambda_g$, or some translate (coset) $\Lambda_g + a$ of $\Lambda_g$, that lie inside some N-dimensional boundary region $\underline{R}_b$. (A lattice is a set of points in N-space that form a group under ordinary Euclidian addition.) For example, a uniform scalar quantizer codebook is the set of M points from the translate $Z + \frac{1}{2}$ of the one-dimensional integer lattice $\Lambda_g = Z$ that lie within the length-M interval $\underline{R}_b = (-M/2, M/2]$.

The principle performance criteria of a quantizer codebook are its rate and its mean-squared error. The rate of $C(\Lambda_g; \underline{R}_b)$ is $$b = \log_2 |C(\Lambda_b; \underline{R}_b)|$$

bits per N dimensions, where $|C(\Lambda_g; \underline{R}_b)|$ s the number of pioints c in $C(\Lambda_g; \underline{R}_b)$. Given a source vector r, the quantization error $e(r)$ is the difference $r - q(r)$ between r and the quantized vector $q(r)$ in the codebook $C(\Lambda_g; \underline{R}_b)$ into which r is mapped. The mean-squared error per dimension is $$MSE = E\{\|e\|^2\}/N,$$

where the expectation (E) is over the probability density $p(r)$ of source vectors r. We shall usually assume that r is a sequence of N independent, identically distributed (i.i.d.) one-dimensional random variables r with probability density $p(r)$.

Within the boundary region $\underline{R}_b$, the quantization cells (decision regions) of a lattice quantizer codebook can be chosen as translates of a fundamental region $R(\Lambda_g)$ of $\Lambda_g$, which we call the granular cell $\underline{R}_g$. (A fundamental region of $\Lambda_g$ is a region in N-space that contains one and only one point from each coset of $\Lambda_g$). A minimum mean-squared error (MMSE) lattice quantizer maps the incoming source vector r to the closest codeword c in the codebook. Its granular cell $\underline{R}_g$ is then the Voronoi region $\underline{R}_V(\Lambda_g)$ of $\Lambda_g$. (The Voronoi region of $\Lambda_g$ is the set of points that are at least as close to the origin as any other point in $\Lambda_g$. With the ties at the boundary resolved, a Voronoi region is a fundamental region. In a uniform scalar quantizer codebook, the granular cell. In a uniform scalar quantizer codebook, the granular cell $\underline{R}_g$ is a line segment of length 1.

The volume of the granular cell $R(\Lambda_g)$ is the fundamental volume of $V(\Lambda_g)$ of $\Lambda_g$. If the volume of $\underline{R}_b$ is $V(\underline{R}_b)$, then the size of the codebook is $$|C(\Lambda_g \cdot \underline{R}_b)| = V(\underline{R}_b)/V(\underline{R}_g) = V(\underline{R}_b)/V(\Lambda_g),$$

so its rate is $b = \log_2 V(\underline{R}_b)/V(\Lambda_g)$ bits per N dimensions, or $\beta = b/N$ bits per dimension.

Asymptotic Lattice Quantization Theory: Granular Gain and Boundary Gain

The mean-squared error of a lattice quantizer can be written as the sum $$MSE = (1 - P_{ol}) \cdot MSE_g + P_{ol} \cdot MSE_{ol}$$

where the overload probability $P_{ol}$ is the probability tat the source vector r falls outside $\underline{R}_b$, $MSE_g$ is the MSE given that r is inside $\underline{R}_b$, and $\overline{MSE}_{ol}$ is the MSE given that r is outside $\underline{R}_b$. With large codebooks, $MSE_{ol}$ will be large compared to $MSE_g$. Then the codebook will be scaled so that the overload probability $P_{ol}$ will be close to zero.

With sufficiently large codebooks, we can treat the source probability density p(r) as uniform over each quantization cell. Then $MSE_g$ can be approximated as $$MSE_g \approx [V(\underline{R}_g)]^{-1} \int_{\underline{R}_g} \|r - q(r)\|^2 / N \, dr = G[\underline{R}_g] \cdot [V(\underline{R}_g)]^{2/N}$$

where $G[\underline{R}_g]$ is the normalized second moment of the granular cell $\underline{R}_g$, a dimensionless quantity that depends only on the shape of the cell. If $\underline{R}_g$ is an N-cube of side $\alpha$, then $[V(\underline{R}_g)]^{2/N} = \alpha^2$, $MSE_g = \alpha^2/12$, and $G[\underline{R}_g] = 1/12$. $G[\underline{R}_g]$ can be reduced by making $\underline{R}_g$ more spherical, resulting in a 'granular gain'

$$\gamma_g[\underline{R}_g] = 1/(12 G[\underline{R}_g]).$$

The granular gain is the reduction in granular MSE that can be obtained by making the granular cell more spherical, relative to a cube. We define $\gamma_g(\Lambda_g)$ as the granular gain of a lattice quantizer with $\underline{R}_g$ equal to the Voronoi region $R_V(\Lambda_g)$.

The granular gain $\gamma_g[\underline{R}_g]$ of a cell $\underline{R}_g$ has precisely the same form as the shaping gain $\gamma_s$ of a bounding region $\underline{R}_s$ as defined in the theory of coded modulation (Forney and Wei, "Multi-dimensional Constellations—Part 1: Introduction, Figures of Merit, and Generalized Cross Constellation", IEEE JSAC, 1989). It is known that the maximum possible shaping gain is 1.53 dB, which is achievable with an N-sphere as $N \to \infty$. Voronoi regions of lattices can have shaping gains that approach 1.53 dB with increasing dimensionality (Forney, "Multi-dimensional Constellations—Part II: Voronoi Constellations", IEEE JSAC, 1989).

We should emphasize that granular gain is independent of the source probability distribution, but our definition depends on taking MSE as the distortion criterion.

The overload distortion $P_{ol} \cdot MSE_{ol}$ is primarily controlled by the probability of overload $P_{ol}$. With a well-designed (properly scaled) large uniform scalar quantizer codebook, it is known that $$MSE_g >> P_{ol} \cdot MSE_{ol}.$$

If a uniform scalar quantizer is applied independently to each component of a source vector r, then the N-dimensional quantization cell $\underline{R}_g$ is an N-cube of side 1, and the boundary region is an N-cube of side M and volume $M^N$. If this N-cube can be replaced by a smaller region $\underline{R}_b$ without significantly increasing the overload probability, then the size of the codebook can be reduced by a factor of about $M^N/V(\underline{R}_b)$, and its rate can therefore be reduced by $\log_2 M^N/V(\underline{R}_b)$ bits per N dimensions. Alternatively, at the same rate, the granular cells can be scaled by a factor of $V(\underline{R}_b)/M^N$ per N dimensions, or by a scale factor of $V(\underline{R}_b)^{1/N}/M$ per dimension, which leads to a reduction in MSE by a factor of $\gamma_b^{-1}$, where the 'boundary gain' $\gamma_b$ is defined as $$\gamma_b = M^2/V(\underline{R}_b)^{2/N}.$$

Whereas granular gain is independent of the source distribution, the achievement of boundary gain depends on the source probability distribution p(r). When the constituent one-dimensional source density p(r) is uniform over a line segment of length M, the best shape for $\underline{R}_b$ is an N-cube of side M, and no boundary gain can be obtained. However, if the source density is nonuniform, significant boundary gains are possible.

Asymptotic Lattice Quantization Theory for Gaussian Sources

Consider for example a Gaussian source of mean zero and variance $\sigma^2$. With an M-point uniform scalar quantizer with scale factor $\alpha$ and $\underline{R}_b = (-\alpha M/2, \alpha M/2]$, the overload probability per dimension is $$P_{ol} = 2 \cdot Q(\alpha M/2\sigma),$$

where $Q(\cdot)$ is the Gaussian probability of error function. This can be rewritten as $$P_{ol} = 2 \cdot Q[(3/SQNR_{norm})^{\frac{1}{2}}],$$

where the normalized signal-to-quantization noise ratio $SQNR_{norm}$ is defined as $$SQNR_{norm} = (\sigma^2/MSE_g)/2^{2\beta},$$

where $\beta = \log_2 M$ is the quantizer rate per dimension, and $MSE_g = \alpha^2/12$. Of course, the same expression is obtained when $\underline{R}_b$ is an N-cube of side $\alpha M$ and the size of the quantizer codebook is $M^N = 2^b = 2^{\beta N}$.

It is shown in rate-distortion theory that to quantize a Gaussian source with variance $\sigma^2$ with a mean-squared quantization error of $MSE_g$ requires a codebook rate $\beta$ that satisfies $$\beta \geq (\tfrac{1}{2}) \log_2 (\sigma^2/MSE_g).$$

This is called the rate-distortion limit. Thus $SQNR_{norm} \leq 1$, with $SQNR_{norm} = 1$ representing the rate-distortion limit.

For a general boundary region $\underline{R}_b$, the overload probability depends primarily on the minimum distance from the origin to any point on the boundary of $\underline{R}_b$, which is called the packing radius $\rho(\underline{R}_b)$. In quantization of Gaussian sources, the best $\underline{R}_b$ is an N-sphere of radius $\rho(\underline{R}_b)$; then $P_{ol}$ is of the order of $\exp -\rho^2(\underline{R}_b)/\sigma^2$. If $\underline{R}_b$ is a convex polytope with $K(\underline{R}_b)$ faces at minimum distance $\rho(\underline{R}_b)$ from the origin, then the overload probability per dimension is approximately equal to $$P_{ol} \approx [K(\underline{R}_b)/N] \cdot Q[\rho(\underline{R}_b)/\alpha].$$

This can be rewritten as $$P_{ol} \approx K(\underline{R}_b) \cdot Q[(3\gamma_g[\Lambda_g]\gamma_b[\underline{R}_b]/SQNR_{norm})^{\frac{1}{2}}], \quad (*)$$

where we have made the substitutions $$SQNR_{norm} = (\rho^2/MSE_g)/2^{2\beta};$$

$$MSE_g \approx G[\underline{R}_g] \cdot [V(\underline{R}_g)]^{2/N} = [V(\underline{R}_g)]^{2/N}/(12\gamma_g[\Lambda_g]);$$

$$2^\beta = 2^{b/N} \approx [V(\underline{R}_b)/V(\underline{R}_g)]^{1/N},$$

and defined $$\kappa(\underline{R}_b) = K(\underline{R}_b)/N;$$

$$\gamma_b[\underline{R}_b] = 4\rho^2(\underline{R}_b)/[V(\underline{R}_b)]^{2/N}.$$

The error coefficient $\kappa(\underline{R}_b)$ is the number of nearest faces, normalized per dimension. The boundary gain $\gamma_b[\underline{R}_b]$ is consistent with our earlier volumetric definition of boundary gain, but is now in a form where it is recognizable as equal to the 'coding gain' $\gamma_c$ of $\underline{R}_b$, if $\underline{R}_b$ is a typical decision region in a lattice-coded modulation system.'

The expression (*) is significant. It shows that, for large constellations, the overload probability primarily depends on the product $$\gamma_g[\underline{R}_g] \cdot \gamma_b[\underline{R}_b]/SQNR_{norm} = \gamma_g[\underline{R}_g] \cdot \gamma_b[\underline{R}_b] \cdot MSE_g \cdot 2^{2\beta}/\sigma^2.$$

This shows how the rate $\beta$ and granular MSE trade off against the overload probability $P_{ol}$. Since at high rates total MSE is dominated by granular MSE, it also shows that asymptotically the signal-to-quantization noise ratio can be improved by two factors that are separable and additive: the granular gain $\gamma_g[\underline{R}_g]$, and the boundary gain $\gamma_b[\underline{R}_b]$. The total gain of a lattice quantizer with codebook $C(\Lambda_g; \underline{R}_b)$ over a uniform scalar quantizer is given by $$\gamma(\Lambda_g; \underline{R}_b) = \gamma_g(\Lambda_g) \cdot \gamma_b(\underline{R}_b).$$

At practical rates and for non-Gaussian sources whose probability distributions have long tails, the actual gain will be somewhat smaller, because although it may be relatively small, $MSE_{ol}$ is often not negligible. When we replace the N-cube shape of a uniform scalar quantizer with a more spherical shape $\underline{R}_b$, overload distortion needs to be decreased somewhat by increasing $V(\underline{R}_b)$, and this increases the overall MSE.

Quantization vs. Transmission

The boundary gain $\gamma_b[\underline{R}_b]$ has the same form as the coding gain of a decision region $\underline{R}_c$ in coded modulation. If $\underline{R}_b$ is an N-cube, then $\gamma_b[\underline{R}_b] = 1$. It is known that $\gamma_b[\underline{R}_b]$ can be much larger than 1.53 dB. In fact, it can be shown that the achievable boundary gain increases with decreasing overload probability, without limit; and that in combination with the ultimate granular gain of 1.53 dB, the boundary gain can be large enough the $SQNR_{norm} = (\sigma^2/MSE_g)/2^{2\beta}$ can approach 1, the rate-distortion limit.

More precisely, it is known that with a lattice code $C(\Lambda_c; \underline{R}_s)$, the probability is well approximately at high rates by $$Pr(E) \approx \kappa(\Lambda_c) \cdot [(3 \cdot \gamma_s[\underline{R}_s] \cdot \gamma_c[\Lambda_c] \cdot SNR_{norm})^{\frac{1}{2}}], \quad (**)$$

where $\gamma_s(\underline{R}_s)]$ is the shaping gain of $\underline{R}_s$, $\kappa(\Lambda_c)$ and $\gamma_c[\Lambda_c]$ are the error coefficient and coding gain of $\Lambda_c$, or of the Voronoi region $\underline{R}_V(\Lambda_c)$, and $SNR_{norm} = SNR/2^{2\beta}$ is the channel signal-to-noise ratio SNR, normalized for the code rate $\beta$ in bits per dimension. Thus the probability of error for a given $SNR_{norm}$ is the same as the overload probability (*) if $\gamma_s[\underline{R}_s] = \gamma_g[\Lambda_g]$, $\kappa(\Lambda_c) = \kappa(\underline{R}_b)$, $\gamma_c[\Lambda_c] = \gamma_b[\underline{R}_b]$, and $SNR_{norm} = 1/SQNR_{norm}$. The first three equalities hold if $\underline{R}_s$ is a version of the Voronoi region of $\Lambda_g$, and $\underline{R}_b$ is a version of the Voronoi region of $\Lambda_c$. Finally, if we define the effective coding gain $\gamma_{g_{eff}}[\Lambda_c]$ so that the following equality is true $$Pr(E) = 2 \cdot Q[(3 \cdot \gamma_s[\underline{R}_s] \cdot \gamma_{eff}[\Lambda_c] \cdot SNR_{norm})^{\frac{1}{2}}], \quad (***)$$

then $$P_{ol} = 2 \cdot Q[(3 \cdot \gamma_g[\Lambda_g] \cdot \gamma_{eff}[\underline{R}_b]/SQNR_{norm})^{\frac{1}{2}}],$$

where $\gamma_{eff}[\underline{R}_b]$ is defined as the effective coding gain of the lattice $\Lambda_b$ of which $\underline{R}_b$ is the Voronoi region. A result of deBuda, "Some optimal codes have structure", IEEE JSAC, 1989, shows that there exist lattices $\Lambda_b$ such that $P_{ol}$ can be arbitrarily small for $\gamma_g[\Lambda_g]/SQNR_{norm}$ arbitrarily close to $\pi e/6$ (1.53 dB), which shows that the rate-distortion limit is arbitrarily closely approachable with lattice codebooks.

We see that there are notable qualities between lattice quantization and lattice-coded modulation. In the latter application, we want to reliably send symbols from a lattice codebook $C(\Lambda_g; \underline{R}_b)$ over a memoryless additive Gaussian noise channel under an average transmit energy constraint; and we find that the total gain is $\gamma_g[\Lambda_g] \cdot \gamma_b[\underline{R}_b]$. In coded modulation with a lattice code $C(\Lambda_c; \underline{R}_s)$, the total gain is $\gamma_s[\underline{R}_s] \cdot \gamma_c[\Lambda_c]$. The coding gain $\gamma_c[\Lambda_c]$ has to do with the granular decision regions, and shaping gain $\gamma_s \underline{R}_s$ ] has to do with the bounding region $\underline{R}_s$; in quantization the roles of the analoguous quantities are reversed. But the total achievable gains are the same. For example, if the granular cell $\underline{R}_g$ in quantization and the codebook region $\underline{R}_s$ in transmission have the same shape, they produce the same amount of gain: $\gamma_g[\underline{R}_g] = \gamma_s[\underline{R}_s]$. If the probability of overload in quantization is the same as the probability of error in transmission, if the source distribution in quantization is the same as the noise distribution in transmission, and if the codebook region $\underline{R}_b$ in quantization and the decision region $\underline{R}_c$ in transmission have the same shape, then they will have the same gains: $\gamma_b[\underline{R}_b] = \gamma_c[\underline{R}_c]$.

Much previous work on lattice quantization has focused on sources with a uniform distribution. In this case, all that can be achieved is the 1.53 dB ultimate granular gain. However, for sources with nonuniform distributions, such as Gaussian sources, there is much more to be gained by appropriately choosing the codebook boundary.

For sources with nonuniform probability distributions, codebooks with optimum boundaries are difficult to implement at high rates or in high dimensions, because they require large tables to implement the map from codewords to bits and from bits to codewords. Therefore, in this paper we are interested in techniques that use codebooks with code-structured regions $\underline{R}_b$ that can eliminate the storage problem at the expense of decoding complexity. The principles will be described first for lattices and later for trellis codes. Lattices and trellis codes are collectively known as coset codes.

LATTICE QUANTIZER CODEBOOKS WITH LATTICE-STRUCTURED BOUNDARIES

Principles

Lattice codebooks with lattice-structured boundaries (Voronoi codebooks) were first introduced by Conway and Sloane using lattice partitions of the type $\Lambda/M\Lambda$. They were generalized by Forney to arbitrary partitions $\Lambda/\Lambda'$ in the context of coded modulation. In this section we show how such codebooks can be used for vector quantization.

Let $\Lambda_g/\Lambda_b$ be an N-dimensional lattice partition of order $|\Lambda_g/\Lambda_b| = 2^{N\beta}$. The Voronoi codebook $C(\Lambda_g/\Lambda_b)$ is then defines as the set of all points in a translate $\Lambda_g + a$ of $\Lambda_g$ that lie in the Voronio region $\underline{R}_V(\Lambda_b)$. With resolution of ties on the boundary of $\overline{R}_V(\Lambda_b)$ the size of $C(\Lambda_g/\Lambda_b)$ is precisely $|\Lambda_g/\Lambda_b| = 2^{N\beta}$, so the codebook rate is b bits per dimension.

The results of the previous section show that the granular gain $\gamma_g(\Lambda_g)$ is the shaping gain of the Voronoi region $\underline{R}_V(\Lambda_g)$, while for a Gaussian source the boundary gain is $$\gamma_b(\Lambda_b) = 4\rho^2(\underline{R}_b)/[V(\underline{R}_b)]^{2/N} = d_{min}^2(\Lambda_b)/[V(\Lambda_b)]^{2/N},$$

the coding gain of the lattice $\Lambda_b$, since the packing radius $\rho(\underline{R}_b)$ of the Voronoi region $\underline{R}_V(\Lambda_b)$ is half the minimum distance $d_{min}(\Lambda_b)$ between points in $\Lambda_b$. Lattice coding gains (Hermite's parameter) are tabulated in the lattice and coding literature. For instance, the 8-dimensional Gosset lattice $E_8$, which can be represented by a simple 4-state trellis diagram, has a coding gain of 2 (3.01 dB). The 24-dimensional Leech lattice $\Lambda_{24}$, which can be represented by a 256-state trellis diagram, has a coding gain of 4 (6.02 dB).

A lattice quantizer with a Voronoi codebook $C(\Lambda_g/\Lambda_b)$ may be implemented as follows (for simplicity, in the discussion that follows, we will assume a Gaussian source distribution; however, these principles are applicable to a variety of source distributions with minor modifications which will be pointed out as we go along). The quantizer first determines the closest point q in the granular lattice $\Lambda_g$; the granular cells are then translate of the Voronoi region $\underline{R}_V(\Lambda_g)$. With high probability, the quantized vector q(r) will be in the Voronoi region $\underline{R}_V(\Lambda_b)$ and thus in the codebook $C(\Lambda_b/\Lambda_b)$. We defer for a moment the question of what happens when q(r) is not in $C(\Lambda_g/\Lambda_b)$. The quantizer then sends $N\beta$ bits indicating which of the $|\Lambda_g/\Lambda_b|$ code vectors is q(r). Mapping methods will be discussed below.

At the receiver, method for mapping received bits back to the quantized vector generally have the following structure. The quantized bits are first mapped into any vector $c'$ that is in the same coset of $\Lambda_g$ as the code vector c corresponding to those bits. A lattice decoder for $\Lambda_b$ then determines the closest vector $c_b$ in $\Lambda_b$ to $c'$. The difference vector $c' - c_b$ is then the vector of least weight in the coset $\Lambda_g + c'$, which by definition must be c.

Usually N is even and $\Lambda_g$ and $\Lambda_b$ are so-called binary lattices. Such lattices have sublattices and superlattices of the form $R^{82} Z^N$, where R is the N-dimensional rotation operator. (These concepts have been defined in Forney, Jr., "Coset codes—introduction and geometrical classification", IEEE Trans. Inform. Theory, 1988). Then there is a lattice partition chain $\Lambda_g/R^{\mu_1}Z^N/R^{\mu_2}Z^N/\Lambda_b$, where $\mu_1$ and $\mu_2$ are the least and greatest $\mu$, respectively, such that there is a chain of this form. The orders of these partitions are $$|\Lambda_g/R^{\mu_2}Z^N| = 2^{k(\Lambda_g)};$$

$$|R^{\mu_1}Z^N/R^{\mu_2}Z^N| = 2^{N(\mu_2-\mu_1)/2};$$

$$|R^{\mu_2}Z^N/\Lambda_b| = 2^{r(\Lambda_b)},$$

where $k(\Lambda_g)$ is defined as the informativity of $\Lambda_g$ and $r(\Lambda_b)$, as the redundancy of $\Lambda_b$.

The reconstruction of codebook vectors from groups of $N\beta = k(\Lambda_g) + N(\mu_2-\mu_1)/2 + r(\Lambda_b)$ quantized bits can then be accomplished as in FIG. 1, where we denoted $N(\mu_2-\mu_1)$ as n. The first $k(\Lambda_g)$ bits specify a coset representative $a_1$ of one of the $2^{k(\Lambda_g)}$ cosets of $R^{\mu_1}Z^N$ in $\Lambda_g$; the next $N(\mu_2-\mu_1)/2$ bits specify a coset representative $a_2$ of one of the $2^{N(\mu_2-\mu_1)/2}$ cosets of $R^{\mu_2}Z^N$ in $R^{\mu_1}Z^N$; and the last $r(\Lambda_b)$ bits specify a coset representative $a_3$ of one of the $2^{r(\Lambda_b)}$ cosets of $\Lambda_b$ in $R^{\mu_2}Z^N$. The sum $c' = a_0 + a_1 + a_2 + a_3$ is then a coset representative for one of the $2^{N\beta}$ cosets of $\Lambda_b$ in $\Lambda_g + a_0$. A decoder for $\Lambda_b$ then finds the vector c of least weight in this coset, which is a vector in the codebook $C(\Lambda_g/\Lambda_b)$. The codebook $C(\Lambda_g/\Lambda_b)$ consists of the $2^{N\beta}$ code vectors c that can be generated by the reconstruction circuit of FIG. 1.

In more detail, we may refine the partition $\Lambda_g/\Lambda_b$ into a chain of $N\beta$ two-way partitions $\Lambda_g = \Lambda_0/\Lambda_1/ \ldots /\Lambda_{N\beta} = \Lambda_b$. Then we can let the $i^{th}$ bit $m_i$ select one of the two cosets of $\Lambda_i$ in the partition $\Lambda_{i-1}/\Lambda_i$, $1 \leq i \leq N\beta$. The coset representative can then be defined by the linear combination $$c' = \Sigma_i m_i g_i,$$

where $g_i$ is any vector such that $g_i \epsilon \Lambda_{i-1}$, $g_i \epsilon \Lambda_i$. This is easily implemented.

The reconstruction circuit of FIG. 1 defines a codebook $C(\Lambda_g/\Lambda_b)$ consisting of one element from each of the $|\Lambda_g/\Lambda_b|$ cosets of $\Lambda_b$ on the translate $\Lambda_g + a_0$ of the lattice $\Lambda_g$. If the decoder is a minimum-weight element of its coset (a coset leader) and lies in the Voronoi region $\underline{R}_V(\Lambda_b)$, so $C(\Lambda_g/\Lambda_b)$ is a Voronoi codebook. For non-Gaussian sources, one would use a different decoder that would generate vectors from a codebook consisting of a system of coset representatives for the $|\Lambda_g/\Lambda_b|$ cosets of $\Lambda_b$, again on the translate $\Lambda_g + a_0$ of the lattice $\Lambda_g$, that is bounded by some other fundamental region $\underline{R}(\Lambda_b)$ of $\Lambda_b$. For example for Laplacian sources, the decoder would use the minimum absolute value elements from the cosets of $\Lambda_b$.

Figure 2:
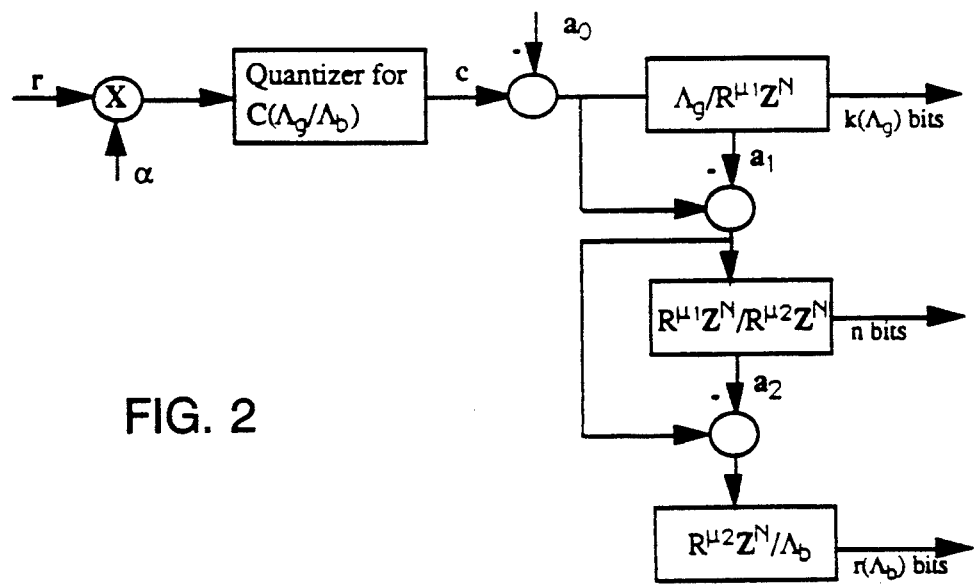
FIG. 2 is a block diagram of an encoder for lattice codebooks with lattice-structured boundaries.

The encoder for the codebook $C(\Lambda_g/\Lambda_b)$ can be implemented as shown in FIG. 2. Here, the source vector r is quantized to some element $q \epsilon \Lambda_g$ using a minimum-distance decoder for the lattice $\Lambda_g$. Lattice decoding algorithms generally ignore codebook boundaries. But, here it is essential that the quantized point q belongs to the codebook. Therefore, when an overload occurs, a correction step is necessary to find a codeword $c \epsilon C$ that lies nearby (later we will discuss methods that largely avoid th is often complicated overload correction). Note that an overload can be detected by using the reconstruction circuit of FIG. 1 in the quantizer; if the reconstructed symbol is different from q then an overload must have occurred.

Since each coset of $\Lambda_b$ in $\Lambda_g + a_0$ contains one and only one codeword c, codewords can be labeled by their coset as shown in FIG. 2. Here the coset of $R^\mu 2Z^N$ in $\Lambda_g$ determines $k(\Lambda_g)$ 'granular bits,' the coset of $R^\mu 2Z^N$ in $R^\mu 1Z^N$ determines $N(\mu_2-\mu_1)/2$ 'boundary bits'. The resulting $N\beta = k(\Lambda_s) + N(\mu_2-\mu_1)/2 + r(\Lambda_c)$ bits are transmitted over a binary channel.

Similarly, the quantized code vector q can be mapped to $N\beta$ bits using the more refined partition $\Lambda_g = \Lambda_0/\Lambda_1/\ldots/\Lambda_{N\beta} = \Lambda_b$, using $N\beta$ mapping stages.

As long as the quantized point is a codeword, it can be reconstructed in the receiver error-free, provided that the channel is error-free.

In summary, in the above method, the mapping rules can be implemented fairly easily. The principal complexity lies in implementing the decoder for $\Lambda_b$ in the reconstruction of the quantized vector.

Optimum Decoders for $\Lambda_b$

The decoder for $\Lambda_b$ should be chosen to minimize the probability of overload $P_{ol}$.

An overload occurs if and only if the quantizer output q(r) is decoded by this decoder to some non-zero element of $\Lambda_b$. Therefore to minimize $P_{ol}$, we should use the maximum likelihood (ML) decoder that would be used if vectors from the lattice $\Lambda_b$ were used to send symbols over an additive noise channel, with noise statistics equal to those of the quantizer output. The coding gain will then be the coding gain of the lattice $\Lambda_b$ on a channel with such noise statistics.

If r is Gaussian, the asymptotically at high rates the ML decoder is a minimum-distance decoder and the voronoi region $R_V(\Lambda_b)$ of $\Lambda_b$ is the optimum boundary region. As already noted, with known lattices one can get coding gains of the order of 3 to 6 dB at around $10^{-5}$ overload probability. As the code complexity increases, the Voronoi regions become more spherical, which increases coding gain, but the decoding complexity also increases.

For source distributions with longer tails (e.g., Laplacian or Gamma distributions), we expect the coding gains to be even larger.

Constituent 1D and 2D Quantizers

We can write the codewords c in terms of their one-dimensional (1D) or two-dimensional (2D) components as $c = [c_1, \ldots, c_N]$ or $[c_1, \ldots, c_{N/2}]$ (assuming that N is even). If the codewords c are chosen from the translate $\Lambda_g + (\frac{1}{2})^N$ and $\Lambda_g$ is an integer lattice, then their 1D or 2D components $c_k$ will belong to $Z + \frac{1}{2}$ or to $Z^2 + (\frac{1}{2})^2$, respectively, since $\Lambda_g$ is a sublattice of $Z^N$. Furthermore, if $2^\mu Z^N$ or $R^\mu 3Z^N$ is a sublattice of $\Lambda_b$, it can be shown (see Forney, Jr., "Multi-dimensional constellations—Part II: Voronoi Constellations" IEEE JSAC, 1989), that the Voronoi region of $\Lambda_b$ is contained in the Voronoi region of $2^\mu Z^N$ or $R^\mu 3Z^N$, from which it follows that $c_k$ must lie in $R_V(2^\mu Z)$ or $R_V(R^\mu 3Z^2)$, respectively. Notice that the latter region has $2^{2\beta+(r(\Lambda_g)+d(\Lambda_b))2/N}$ points, which is larger by a factor of $2^{(r(\Lambda_g)+k(\Lambda_b))2/N}$ times than that would be required with a scalar quantizer. The expansion in one dimension is $2^{(r(\Lambda_g)+k(\Lambda_b))/N}$, provided that $\mu_3$ is even so that $\mu = \mu_3/2$; otherwise $\mu = (\mu_3+1)/2$ and the expansion in 1D is a factor of $2^{(r(\Lambda_g)+k(\Lambda_b)+1)/N}$.

Effect of Overload Errors

There are various strategies for dealing with source vectors r that are mapped into the overload region. They include:

1. Let the encoder circuit of FIG. 2 work without modification.
2. Detect the overload, and map the source vector into an 'erasure,' e.g., the 0 vector.
3. Detect the overload, and try to map r into a code vector c that is close to r.
4. Detect the overload and quantize r with a scalar quantizer. Use one extra bit of information for N dimensions to identify which quantizer is used.

In the first case, r will be quantized into the closest point q in $\Lambda_g + a_0$, but q will be represented by the code vector c in the codebook that is in the same coset of $\Lambda_b$ as q. The distance between q and c will then be at least the minimum distance $d_{min}(\Lambda_b)$ between points in the lattice $\Lambda_b$, which is substantially greater than the magnitude of a typical quantization error, or even than the minimum distance from r to the boundary of $R_b$. Such large errors may seriously degrade the final MSE, and therefore it is important to avoid them.

In the last case, the extra transmitted bit will cost 6/N dB in performance, a loss that will diminish with increasing N.

Effect of Channel Errors

What happens if bit errors occurs in the channel? Bit errors will alter the coset representative, and cause the decoder to output the leader of that altered coset.

In general, if the bits in error select cosets in the lower layers of the partition chain (e.g., the boundary bits), the error in signal space will be larger. To see this, we write the coset representative as $c' = \Sigma_i m_i g_i$, where $g_i \in \Delta_{i-1}$ and $g_i \notin \Delta_i$. The vectors $g_i$ can be selected so that their norms $\|g_i\|^2$ are equal to $d_{min}^2(\Lambda_{i-1})$, $1 \leq i \leq N\beta$, which is non-decreasing as i increases. If the indices of the bits in error belong to some set I, then the received coset representative will be $$c'' = c' + \Sigma_{i \in I} \pm g_i = c + \delta.$$

Then erroneous bits that are lower in the partition chain will create (on the average) larger errors in the coset representative. Of course, what matters is the error in the code vector, or the coset leader. Altering the value of the coset representative c' to $c'' = c' + \delta = c_b + (c+\delta)$, where $\delta = \Sigma_{i \in I} \pm g_i$, can also affect the result of the decoding for $\Lambda_c$, if $(c+\delta)$ lies outside the codebook. This may cause the decoder to select an erroneous element $c_b'$, which leads to a large 'modulo' or 'wraparound' error $(c_b - c_b')$. The recovered code vector is then $\hat{c} = c + (c_b - c_b') - \delta$ Note that this condition is more likely to occur if the original code vector c lies close to the codebook boundary, or if bits that select cosets in the lower layers of the partition chain are in error. Of course, if $(c+\delta)$ lies inside the codebook, then the error in the code vector will be the same as the error in the coset representative.

In summary, higher-order bits and code vectors that lie near the codebook boundary are more susceptible to channel errors.

Effect of Channel Erasures, and Embedded Codebooks

If some of the representative bits are known to be in error, or erased, then the situation may not be quite so bad. A good strategy is to erase all bits of lower order than the erased bit, and to reconstruct the original codeword as the average over all possibilities for these lower-order bits. If the codebook is constructed in an embedded fashion, as will now be described, then a more crudely quantized version of the original source vector r may be obtained.

If $\Lambda_g$ and $\Lambda_b$ are N-dimensional binary lattices, then consider the partition chain $$\Lambda_g/2\Lambda_g/4\Lambda_g/\ldots/2^n\Lambda_g/\Lambda_b,$$

where n is the largest integer such that $\Lambda_b$ is a sublattice of $2^n\Lambda_g$. As coset representatives for the partition $\Lambda_g/2\Lambda_g$, choose N basis vectors $\{g_j, 1 \leq j \leq N\}$ of the lattice $\Lambda_g$, which by definition are elements of $\Lambda_g$ but not of $2\Lambda_g$. These basis vectors determine an N-dimensional parallelotope, called the fundamental parallelotope of $\Lambda_g$, whose volume is $V(\Lambda_g)$. Let $C(2\Lambda_g/\Lambda_b)$ be the center of gravity of this parallelotope:

$$m(\Lambda_g) = \Sigma g_j/2.$$

Suppose that the N bits representing the partition $\Lambda_g/2\Lambda_g$ are erased. Let $C(2\Lambda_g/\Lambda_b)$ be a Voronoi codebook for the partition $2\Lambda_g/\Lambda_g$; then we would like to reconstruct the quantized vector as an element $c + m(\Lambda_g)$ of this cookbook, where the $2^N$ corresponding elements of the original codebook are the vectors $c + \Sigma a_j g_j$, $a_j \in \{0, 1\}$. A codebook with this structure is called an embedded codebook. This process can be continued through the partition chain as far as desired.

For example, let $\Lambda_g = Z$; then this embedded codebook produces the best possible successive approximations of a continuous uniform random variable r by a sequence of finger-grained uniform scalar quantizers. In N dimensions, if $\Lambda_g = Z^N$, then we get the same effect.

EXAMPLE

In this example, we construct codebooks for a memoryless Gaussian source at the rate of $\beta$ bits per dimension using the lattice partition $E_8/2^\beta E_8$.

The codewords are chosen from the translate $E_8 + (\frac{1}{2})^8$ of $E_8$ and the Voronoi region of $\Lambda_b = 2\Theta E_8$ is used as the codebook region $\underline{R}_b$. The relevant partition chain is $$Z^8/E_8/2Z^8/2^\beta Z^8/2^\beta E_8/2^{\beta+1}Z^8.$$

Thus $k(\Lambda_g) = k(\Lambda_b) = |Z^8/E_8| = 4$ and $r(\Lambda_g) = r(\Lambda_b) = |E_8/2Z^8| = 4$. $E_8$ is a mod-2 lattice whose elements are congruent (mod-2) to the codewords of the (8,4) first-order Reed-Muller code. This allows us to represent the map to coset representatives in an even simpler fashion.

Figure 3:
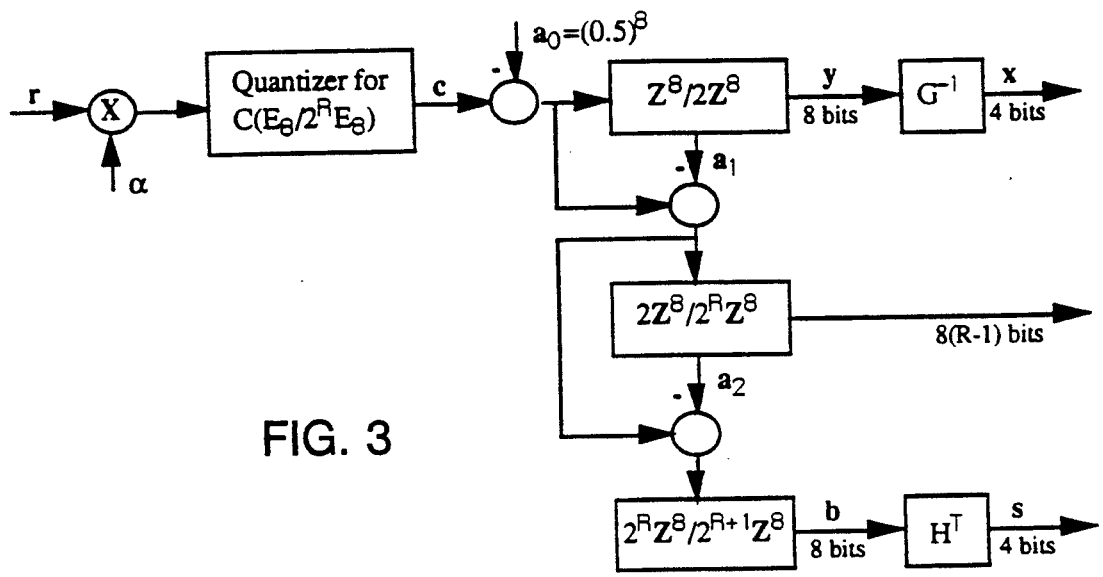
FIG. 3 is a block diagram of an encoder for the codebook $C(E_8/2^b E_8)$.

As shown in FIG. 3, the eight-dimensional scaled source vector $ar$ is first quantized to the nearest codeword $c = [c_1, \ldots, c_4]$ using one of the known decoding algorithms for $E_8$ (e.g., Forney, et al., Efficient Modulation for Band-limited Channels, JSAC, 1984), with some overload correction method to ensure that c lies inside the Voronoi region of $2^\beta E_8$. The two-dimensional elements $c_k$, $k = 1, \ldots, 4$ then lie inside the Voronoi region of $2^{\beta+1}Z^2$, and take values in a $2^{2\beta+2}$ point signal set. (Note that the number of points per dimension is twice as large as that of a scalar quantizer of the same rate. The granular and boundary lattices $E_8$ and $2^\beta E_8$ each increase the size by a factor of $\sqrt{2}$). To find the granular bits, we first determine in which coset $2Z^8 + y$ in $Z^8$ the codeword lies (this can be done simply by determining in which coset of $2Z^2 + y_k$ the two-dimensional elements $c_k$ lie), and then map the binary 8-tuple y to a 4-tuple x according to $x = yG_g^{-1}$, where $G_g$ is a generator matrix for the (8,4) Reed-Muller code and $G_g^{-1}$ is a right inverse to $G_g$. The coset of $2^\mu Z^8$ in $2Z^8$ determines $8(b-1)$ scaling bits. Finally, to find the boundary bits, we determine in which coset $2^{\beta+1}Z^8 + t$ in $2^\beta Z^8$ the codeword lies, again based on corresponding cosets in two-dimensions, and map the binary 8-tuple t into a 4-tuple s according to $s = H_b^T t$, where $H_b^T$ is a syndrome-former matrix for the (8,4) Reed-Muller code. The total number of bits transmitted is $4 + 4 + (\beta - 1)8 = 8\beta$.

Figure 4:
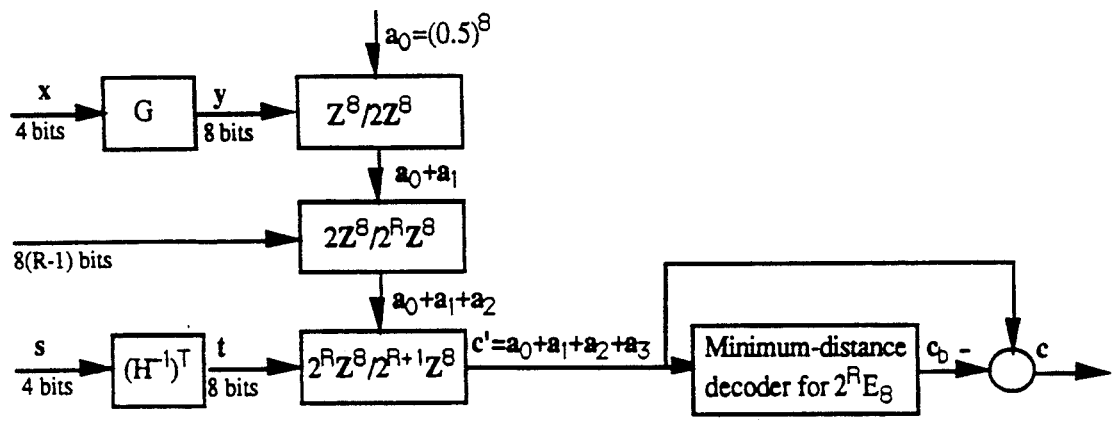
FIG. 4 is a block diagram of a reconstruction circuit for the codebook $C(E_8/2^b E)$.

In the receiver, as shown in FIG. 4, a corresponding inverse map generates the coset representative $c' = c + c_b$, where $c_b$ is an element of the boundary lattice $\Lambda_b = 2^\beta E_8$. The 4 granular bits x are first mapped to an 8-tuple $y = xG_g$, which then selects a coset of $2Z^8 + y$ in $Z^8$; the $8(b-1)$ scaling bits select a coset of $2^\beta Z^8$ in $2Z^8$; and the 4 boundary bits s are first mapped to an 8-tuple $a_3 = t = s(H_b^{-1})^T$, where $(H_b^{-1})^T$ is a left inverse to $H_b^T$, which then identifies the coset representative $c'$. All of these maps are linear and simple to implement. Then, a minimum-distance decoder for $2^\beta E_8$ finds the minimum-norm element $c = c' - c_b$ in the coset $c' - \Lambda_b$, which recovers the code vector c.

Lattice Quantization with Code-Structured Boundaries Based on Regions

In this section, we give an alternative formulation, where we build the N-dimensional codebook from lower-dimensional regions. For simplicity we will focus on two-dimensional regions, but the method can be easily generalized to other dimensions.

For mod-2 lattices, the formulation given in the previous section is identical to the formulation that will be given here. This will be demonstrated with an example.

Principles of Operation

The codewords are chosen from a translate $\Lambda_g + a_0$ of an N-dimensional lattice $\Lambda_g$ (N even), where $a_0 = (\frac{1}{2})^N$, $r(\Lambda_g) = \log_2 |R^\beta 0 Z^N/\Lambda_g|$ is the redundancy and $k(\Lambda_g) = \log_2 |\Lambda_g/R^\beta 1 Z^N|$ is the informativity of $\Lambda_g$, respectively, and $n(\Lambda_g) = k(\Lambda_g) + r(\Lambda_g) = N(\mu_1 - \beta_0)/2$.

To form the boundary region $\underline{R}_b$, we use a rate-$k_b/n_b$ linear binary block code $B_b$ (similar principles will apply to more general finite field codes), and a two-dimensional region $\underline{R}_{2b}$ that contains $2^{2[\beta + (r(\Lambda_g) + kb)/N]}$ points from the translate $R^\beta 0 Z^2 + (\frac{1}{2})^2$ of the rectangular lattice $R^\beta 0 Z^2$. The (N/2)-fold Cartesian product $(\underline{R}_{2b})^{N/2}$ of $\underline{R}_{2b}$ is an N-dimensional region which is a superset of our codebook $C(\Lambda_g; \underline{R}_{2b}, B_b)$.

We partition $\underline{R}_{2b}$ into $2^{2n_b/N}$ subregions, such that reach subregion contains an equal number of points from each of the $2^{2n(\Lambda_g)/N}$ cosets of $R^\beta 1 Z^2$ in $R^\beta 0 Z^2 + (\frac{1}{2})^2$. A signal point in $\underline{R}_{2b}$ can then be labeled by a three-part label $(b_k; d_k; d_k')$, where $b_k$ selects the subregion, $d_k$ is a label that selects the coset of $R^\beta 1 Z^2$ in $R^\beta 0 Z^2 + (\frac{1}{2})^2$, and $d_k'$ identifies the point in that coset. Any N-dimensional point in $(\underline{R}_{2b})^{N/2}$ can be represented by the three-part (N/2)-tuple label $(b; d; d') = (b_1, \ldots, b_{N/2}; d_1, \ldots, d_{N/2}; d_1', \ldots, d_{N/2}')$.

Figure 5:
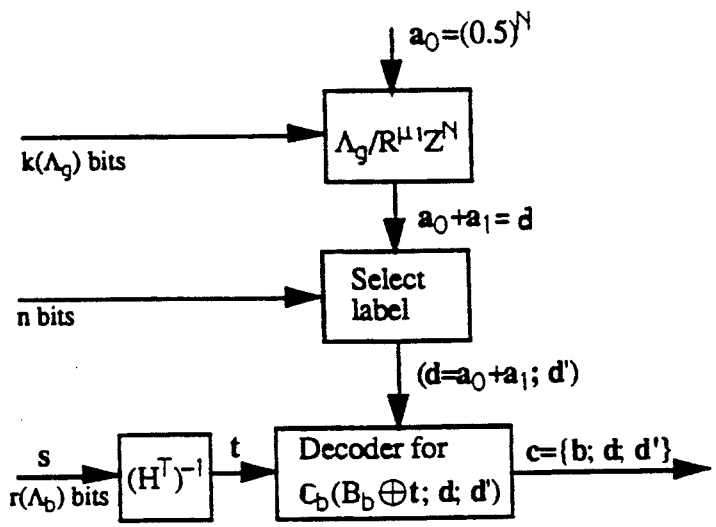
FIG. 5 is a block diagram of a reconstruction circuit for lattice codebooks with structured boundaries using codes and regions.

The codebook is defined by the decoder circuitry shown in FIG. 5. Here $k_g$ granular bits select one of $2^{k(\Lambda_g)}$ cosets of $R^\beta 1 Z^N$ in $\Lambda_g$, which is represented by the coset representative $a_1$, and n scaling bits then determine the two-part label $(d = a_0 + a_1; d')$. Finally, $r_b$ boundary bits represented by the $r_b$-tuple s are mapped into an $n_b$-tuple $t = (H_b^{-1})^T s$, where $(H_b^{-1})^T$ is a left inverse of the syndrome-former matrix $H_b^T$ for the binary code $B_b$. This determines an initial three-part label (t; d; d').

The $n_b$-tuple t is a coset representative for one of $2^{r_b}$ cosets of $B_b$.

Consider the signal space code $\underline{C}_b\{B_b; d; d'\}$ whose elements are described by the labels (b$_b$; d; d'), b$_b \epsilon B_b$. The label translate $\underline{C}_b\{B_b \oplus t; d; d'\}$ is also a signal space code obtained by replacing the binary code $B_b$ by its coset $B_b \oplus t$. Every label translate $\underline{C}_b\{B_b \oplus t; d; d'\}$ contains one and only one code vector c = (b; d; d'), where $b = b_b \oplus t$ is an $n_c$-tuple that lies in the same coset as the coset representative t. The code vectors are the minimum-metric elements of the label-translates. For gaussian sources the metric is the squared norm $|.|^2$, but for other sources other metrics will be more appropriate (e.g. absolute-value metric for Laplacian). In FIG. 5, a decoder for $B_b$ searches the label coset $B_b \oplus t$ to find $b = b_b \oplus t$, which determines the subregions for the code vectors. The labels d and d' remain unaffected.

Figure 6:
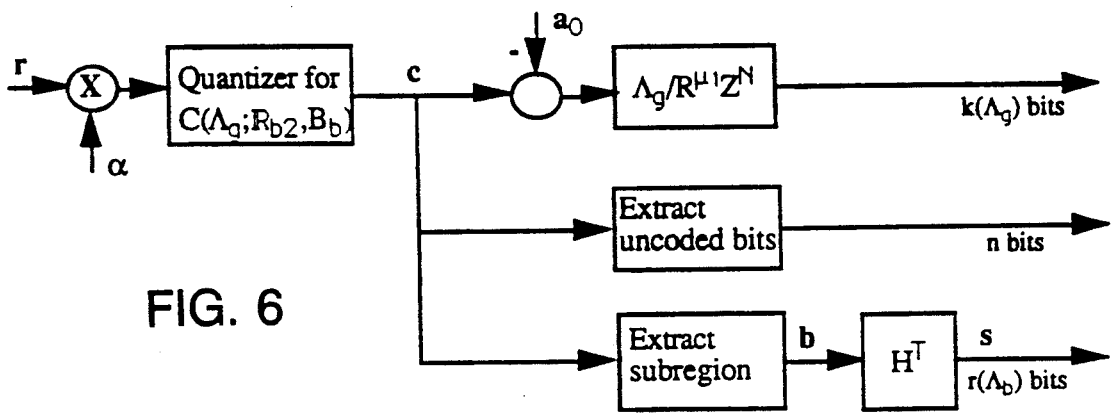
FIG. 6 is a block diagram of an encoder for lattice codebooks with structured boundaries using codes and regions.

The quantizer is illustrated in FIG. 6. Here, the source vector r is first quantized to some codeword $c \epsilon C(\Lambda_g; \underline{R}_{2b}, B_b)$ using a decoder for $\Lambda_g$. Again, we assume that overloads are somehow avoided; we may note here that first we have to ensure that the two-dimensional elements of the quantized point lie inside the region $\underline{R}_{2b}$. This condition can often be simply satisfied, but it is generally not sufficient.

The map from the codeword c to bits is again straightforward. The coset of $R^{\beta 1}Z^N$ in $\Lambda_g$ determines $k(\Lambda_g)$ granular bits, and the coset of $R^{\beta 1}Z^N$ in $R^{\beta 2}Z^N$ determines n scaling bits. The subregions of the two-dimensional elements determine the $n_b$-bit label b. This is transformed to $r_b$ boundary bits using the simple map $s = bH_b^T$. The resulting $N\beta = k(\Lambda_g) + n + r_b$ bits are transmitted over a binary channel.

The label b generated at the transmitter lies in some coset of $B_b$ that can be identified by a coset representative t; so $b = t \oplus b_b$, $b_b \epsilon B_b$. Thus, the boundary bits represented by the $r_b$-tuple s can be written as $s = (tb_b)H_b^T = tH_b^T$, since $b_bH_b^T = 0$. Therefore, in the reconstructor the operation $s(H_b^T)^{-1} = tH_b^T(H_b^T)^{-1} = t$ will recover the coset representative t, as long as the channel is error-free. The label $b = t \oplus b_b$ can be recovered if and only if c = (b; d; d') is the minimum-metric element of the label translate $\underline{C}_b\{b \oplus b; d; d'\}$. Together with the condition $c_k \epsilon R_{2b}$, this determines the codebook boundary. Note that the label translate $\underline{C}_b\{B_b \oplus b; d; d'\}$ is identical to the label translate $\underline{C}_b\{B_b \oplus t; d; d'\}$, because $b = t \oplus b_b$ and $B_b$ is linear. Therefore, any code vector c can be reconstructed from the label (t; d; d') by the decoder at the receiver.

Effect of Overloads

As we mentioned above, a code vector c is always the minimum-metric element of some label translate $\underline{C}_b\{B_b \oplus t; d; d'\}$. Also all other signal points in that translate will lie within a set of subregions that is different from that of the code vector. Therefore, if as a result of an overload, the quantized point is not the minimum metric element, it will be represented as a code vector that lies within a different set of subregions. This can potentially create large errors. Therefore, again overloads should be avoided.

Optimum Decoders

Let q represent the point chosen by the shaping decoder for $\Lambda_g$, before any overload correction is applied. An overload will occur, if a) any of the two-dimensional elements $q_k$ lie outside the region $R_{2b}$, or b) q is not the minimum-metric element of the label translate in which it lies. An optimum decoder and an optimum region $R_{2b}$ must minimize the probability of these events.

It is helpful to draw an analogy with the transmission problem. Suppose the transmitted symbols are chosen from the label translate $\underline{C}_b\{B_b \oplus b_g; d_g; d_g'\}$, and the actual transmitted point is the quantized point q = (b$_g$; d$_g$; d$_g'$). The point at the origin is the received signal, so the noise is just the negative of the quantized point. To detect q, we must use a decoder for the label translate $\underline{C}_b\{B_b \oplus b_g; d_g; d_g'\}$. For optimum decoding this must be a ML decoder for the label translate $\underline{C}_b\{B_b \oplus b_g; d_g'\}$ when the quantized point q is treated as noise.

For a Gaussian source at high rates, the optimum decoder is a minimum-distance decoder and the best two-dimensional region is a circle. Since the received point is at the origin, this becomes a minimum-norm decoder that selects the element with the smallest norm. At low overload probabilities, the performance of the minimum-norm decoder can be characterized in terms of the minimum distance between the elements in the label translate $\underline{C}_b\{B_b \oplus b_g; d_g; d_g'\}$. Note that this implies that signal points in $R_{2b}$ that have the same labels $d_k$ and $d_k'$ but lie in different subregions must be separated as much as possible.

EXAMPLE

In this example, we will show that the codebook described earlier in Section III.6 can also be formulated using the approach of this section.

Figure 7:
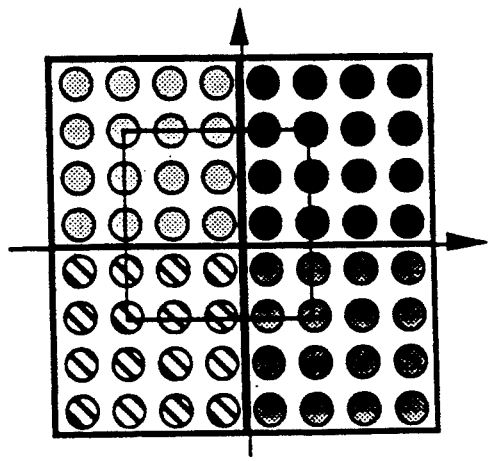
FIG. 7 is a diagram of subregions of $R_{2b}$ for $b=2$; corners of the square have the same labels d and d'.

For granular gain, we again use the lattice $\Lambda_g = E_8$. For the boundary, we use the (8, 4) Reed-Muller code and a two-dimensional region that contains $2^{2\beta+2}$ points ($r(\Lambda_g) = 4$, $k_b = 4$) from the translate $Z^2 + (\frac{1}{2})^2$ of the integer lattice $Z^2$ that lie inside a square region $\underline{R}_{2b}$, which is a Voronoi region of $2^{\beta+1}Z^2$. We take quadrants as subregions, thus partitioning $\underline{R}_{2b}$ into 4 subregions ($n_b = 8$, $2n_b/N = 4$), and to points that lie in the same coset of $2^\beta Z^2$ we give the same labels d and d', as indicated in FIG. 7 for $\beta = 2$. Each subregion contains a total of $2^{2\beta}$ points with $2^{2\beta-2}$ points from each coset of $2Z^2$ in $Z^2 + (\frac{1}{2})^2$.

Figure 8:
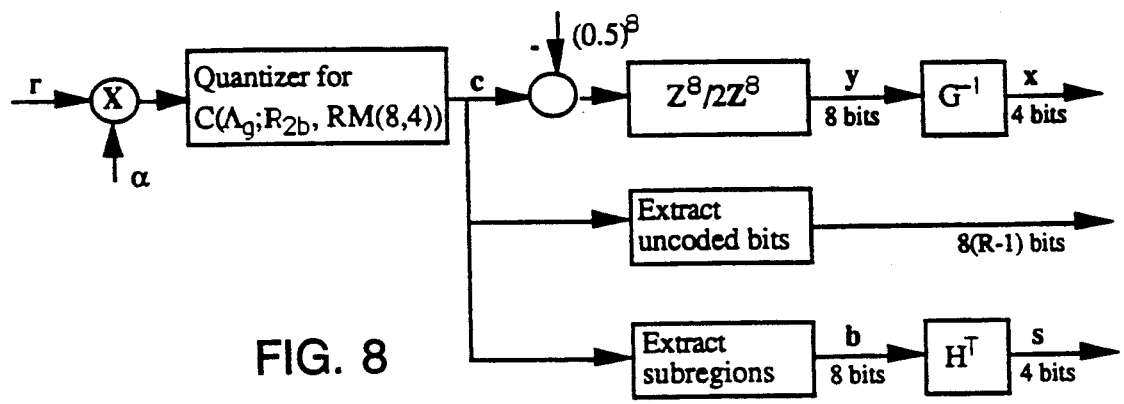
FIG. 8 is a block diagram of a reconstruction circuit for the codebook $C(E_8; \underline{R}_{2b}, RM(8,4))$.

In the encoder, shown in FIG. 8, the only notable difference is that the 8-tuple b is now viewed as representing the quadrants, rather than the cosets of $2^{\beta+1}Z^2$ in $2^\beta Z^2$, but the result is the same.

Figure 9:
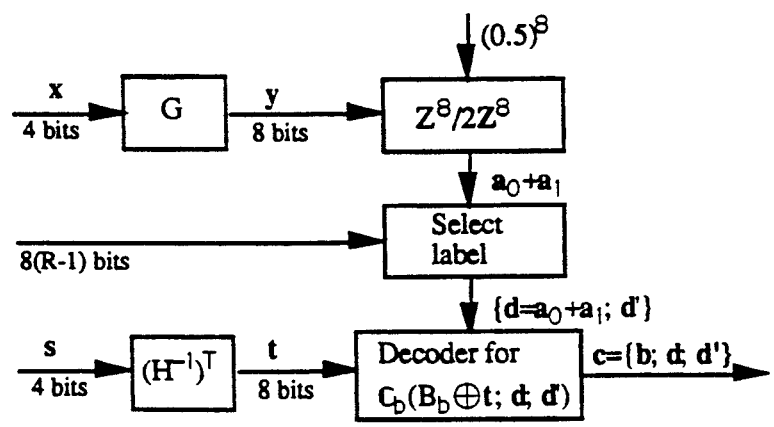
FIG. 9 is a block diagram of an encoder for the codebook $C(E_8; \underline{R}_{2b}, RM(8,4))$.

In the receiver the only notable difference is the implementation of the decoder; the end result is again the same. Because of the special way the subregions and the labels are defined, the label translates in this example correspond to signal space translates. In fact, the signal space code $\underline{C}_b\{RM(8,4); d; d'\}$ is merely the lattice $2^\beta E_8$, and its label translates $\underline{C}_b\{B_b \oplus t; d; d'\}$ correspond to cosets $c' - 2^\beta E_8$, where c' = (t; d; d'). Therefore, the quantizer implementations shown in FIGS. 9 and 5 produce the same results.

TRELLIS-CODED QUANTIZATION

Trellis-Coded Quantization with Trellis-Structured Boundaries

Principles of Operation

The methods described in previous sections for lattices will now be extended to trellis codes. Here, the formulation will be based on sequences, rather than finite-dimensional vectors.

Let $\underline{C}_g(\Lambda_g/\Lambda_g'; C_g)$ be a trellis code based on an N-dimensional lattice partition $\Lambda_g/\Lambda_g'$ and a binary convolutional code $C_g$ of rate $k_g/n_g$, and similarly let $\underline{C}_b(\Lambda_b/\Lambda_b'; C_b)$ be a trellis code based on the N-dimensional lattice partition $\Lambda_b/\Lambda_b'$ and a binary convolutional code $C_b$ of rate $k_b/n_b$. Let $r_g = n_g - k_g$ and $r_b = n_b - k_b$ denote the redundancies of the convolutional codes $C_g$ and $C_b$, respectively. Here for illustrative purposes we assume that the granular and boundary codes are both trellis codes. It will be apparent to those skilled in the art that trellis codes can be used to form the granular or the boundary region only and the other component can be formed using lattices, or boundaries can be formed using the concepts of regions and finite field codes either using block or convolutional codes.

A sequence $c_g(D) = \{c_{gk}\}$ in the trellis code $\underline{C}_g$ consists of signal points $c_{gk}$ from a translate $\Lambda_g + a$ of the lattice $\Lambda_g$ that lie in a sequence of cosets of $\Lambda_g'$ in $\Lambda_g + a$ that can be selected by the convolutional encoder $C_g$. The code $\underline{C}_b$ is defined similarly. However, the lattice $\Lambda_b$ is untranslated.

We introduce the partition chain $R^{\beta 0}Z^N/\Lambda_g/\Lambda_g'/R^{\beta 1}Z^N/R^{\beta 2}Z^N/\Lambda_b/\Lambda_b'/R^{\beta 3}Z^N$, where $|R^{\beta 0}Z^N/\Lambda_g| = 2^{r(\Lambda_g)}$, $|\Lambda_g'/R^{\beta 1}Z^N| = 2^{k(\Lambda_g=)}$, and $|R^{\beta 2}Z^N/\Lambda_b| = 2^{r(\Lambda_b)}$, $|\Lambda_b'/R^{\beta 3}Z^N| = 2k(\Lambda_b')$. The trellis code $\underline{C}_g$ is represented in augmented form (see Forney, Jr., "Coset Codes I: Introduction and Geometrical Classification," IEEE Inform. Theory, 1988) as the code $\underline{C}_g (R^{\beta 0}Z^N/R^{\beta 1}Z^N; C_g')$, where $C_g'$ is a rate $\{k(\Lambda_g') + k_g\}/\{k(\Lambda_g') + n_g\}$ convolutional encoder with some generator matrix $G_g'$. Similarly, the trellis code $\underline{C}_b$ is represented in augmented form as the code $\underline{C}_b (R^{\beta 2}Z^N/R^{\beta 3}Z^N; C_b')$, where $C_b'$ is a rate $\{k(\Lambda_b') + k_b\}/\{k(\Lambda_b') + n_b\}$ convolutional encoder with some syndrome-former matrix $(H_b')^T$.

Figure 10:
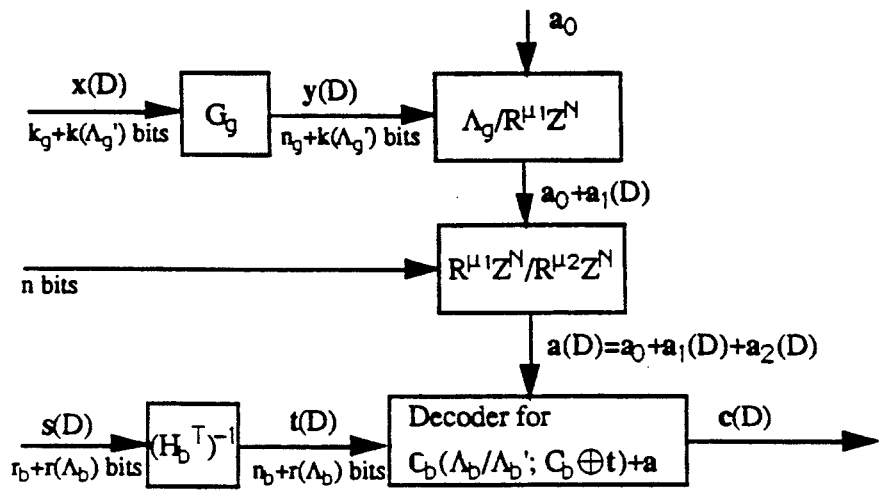
FIG. 10 is a block diagram of a reconstruction circuit for trellis codebooks with trellis-structured boundaries.

The codebook $C(\underline{C}_g, \underline{C}_b)$ is the set of sequences in $\underline{C}_g$ that can be selected by the reconstruction circuit shown in FIG. 10. Here, $k(\Lambda_g') + k_g$ granular bits $x_k$ are encoded by the feedback-free generator $G_g$ according to $y(D) = x(D)G_g$, and the outputs $y_k$ identify one of $2^{k(\Lambda_g') + k_g}$ cosets of $R^{\beta 1}Z^N$ in $\Lambda_g + a_0$, which is represented by the coset representative $a_0 + a_{1k}$. Then, n'scaling' bits select a coset of $R^{\beta 2}Z^N$ in $R^{\beta 1}Z^N$, which is represented by the coset representative $a_{k'a0} + a_{1k} + a_{2k}$. Finally, $r(\Lambda_b) + r_b$ boundary bits represented by the $[r(\Lambda_b) + r_b]$-bit label $s_k$ are mapped into an $[n(\Lambda_b) + n_b]$-bit label $t$ according to $t(D) = s(D)(H_b'^{-1})^T$, where $(H_b'^{-1})^T$ is a feedback-free left inverse of the syndrome-former matrix $H_b'^T$ for the binary code $C_b'$. The $[n(\Lambda_b) + n_b]$-bit label $t$ is a coset representative for one of $2^{k(\Lambda_b') + r_b}$ cosets of $C_b'$, and identifies a label translate $\underline{C}_b(R^{\beta 2}Z^N/R^{\beta 3}Z^N; C_b' \oplus t(D)) + a(D)$ of the coset (or signal space translate) $\underline{C}_b(R^{\beta 2}Z^N/R^{\beta 3}Z^N; C_b') + a(D)$ of the trellis code $\underline{C}_b$.

Every label translate $\underline{C}_b(R^{\beta 2}Z^N/R^{\beta 3}Z^N; C_b' \oplus t(D)) + a(D)$ contains one and only one code sequence $c(D)$ which has the mininum metric. In FIG. 10, a sequence decoder searches the label space $C_b' \oplus t(D)$ to find that representative.

Figure 11:
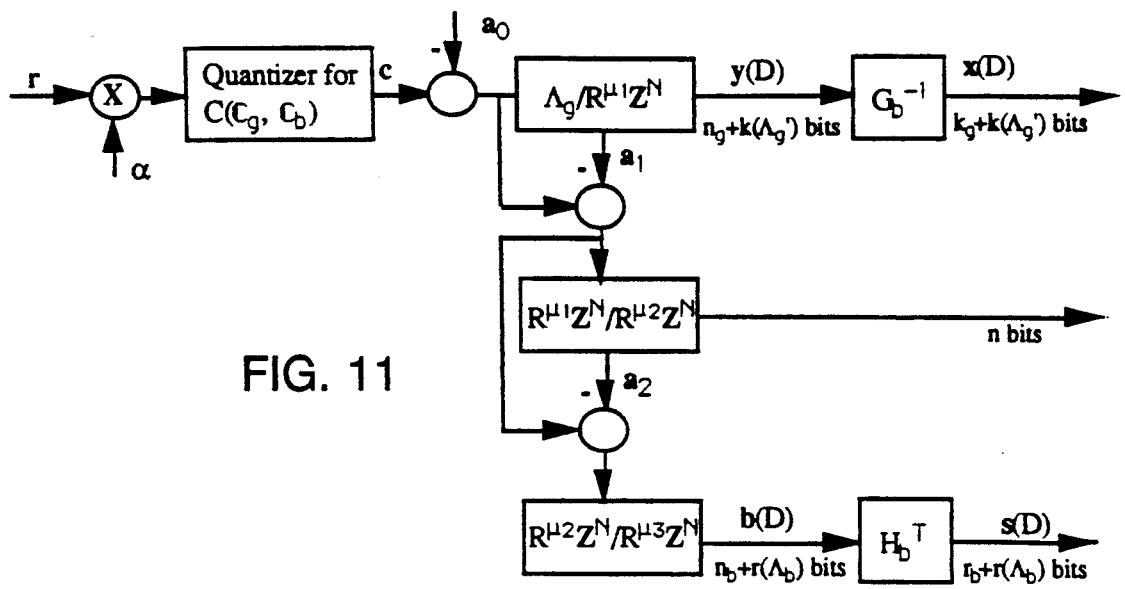
FIG. 11 is a block diagram of a quantizer for trellis codebooks with trellis-structured boundaries.

The corresponding encoder is illustrated in FIG. 11. Here, the scaled source sequence $\alpha r(D)$ is first quantized to some code sequence $c(D)$ using a trellis decoder (e.g., a Viterbi algorithm) for $\underline{C}_g$. Again, we assume that overloads are somehow avoided.

The map from the code sequence to bits is again straightforward. The coset of $R^{\beta 1}Z^N$ in $\Lambda_g + a_0$ determines the $k(\Lambda_g') + k_g$ granular bits, and the coset of $R^{\beta 1}Z^N$ in $R^{\beta 2}Z^N$ determines the n scaling bits. The cosets of $R^{\beta 3}Z^N$ in $R^{\beta 2}Z^N$ determine the $n(\Lambda_b) + n_b$-bit label $b_k$. This is transformed to $r(\Lambda_b) + r_b$ boundary bits using the simple map $s(D) = b(D)H_b^T$. The resulting $N\beta = k(\Lambda_g') + k_g + n + r(\Lambda_b) + r_b$ bits are transmitted over a binary channel. The label $b(D)$ generated at the transmitter lies in some coset of $C_b'$ that can be identified by a coset representative sequence $t(D)$; so, $b(D) = t(D) \oplus c_b(D)$, where $c_b(D) \in C_b'$. Thus, the sequence of boundary bits $s(D)$ can be written as $s(D) = (t(D) \oplus c_b(D))H_b^T = t(D)H_b^T$, since $c_b(D)H_b^T = 0$. Therefore, in the receiver the operation $s(D)(H_b^{-1})^T = t(D)H_b^T(H_b^{-1})^T = t(D)$ will recover the coset representative $t(D)$, as long as the channel is error-free. In case of occasional channel errors, catastrophic error propagation will not occur, since both $G_g^{-1}$ and $(H_b^{-1})^T$ are feedback-free.

The label sequence $b(D) = t(D) \oplus c_b(D)$ can be recovered if and only if the quantized sequence $c_b(D)$ is the minimum-metric element of the label translate $\underline{C}_b(R^{\beta 2}Z^N/R^{\beta 3}Z^N; C_b' \oplus b(D)) + a(D)$. This determines the codebook boundary. Note that $\underline{C}_b(R^{\beta 2}Z^N/R^{\beta 3}Z^N; C_b' \oplus b(D)) + a(D)$ is identical to the label translate $\underline{C}_b(R^{\beta 2}Z^N/R^{\beta 3}Z^N; C_b' \oplus t(D)) + a(D)$, because $b(D) = t(D) \oplus c_b(D)$ and $C_b'$ is linear. Therefore, any code sequence $c(D)$ can be recovered from a knowledge of the coset representative sequences $a(D)$ and $t(D)$.

Overloads and Optimum Decoders

Let $q(D)$ represent the sequence chosen by the shaping decoder for $\underline{C}_g'$ before any overload correction is applied an overload will occur if $q(D)$ is not the minimum metric sequence of the label translate $\underline{C}_b(R^{\beta 2}Z^N/R^{\beta 3}Z^N; C_b' \oplus b(D)) + a(D)$. The optimum decoder must minimize the probability of this event.

Once again we draw an analogy with the transmission problem. Suppose that the transmitted sequence belongs to the label translate $\underline{C}_b(R^{\beta 2}Z^N/R^{\beta 3}Z^N; C_b' \oplus b(D)) + a(D)$ and the actual transmitted sequence is the quantized sequence $q(D)$. The received sequence is the all-zero sequence. We use a decoder for the label translate $\underline{C}_b(R^{\beta 2}Z^N/R^{\beta 3}Z^N; C_b' \oplus b(D)) + a(D)$ to detect $q(D)$. Again, the optimum decoder is a ML decoder for the label translate.

For a Gaussian Source at high rates, the optimum decoder becomes a minimum-distance decoder. Since the received sequence is the all-zero sequence, this becomes a minimum-norm decoder that selects the sequence with the smallest norm. At low overload probabilities, the performance of the minimum-norm decoder can be characterized in terms of the minimum distance between the sequences in the label-translate $\underline{C}_b(R^{\beta 2}Z^NR^{\beta 3}Z^N; C_b' \oplus t(D)) + a(D)$. Trellis quantization using trellis-structured boundaries can also be formulated using regions and convolutional codes as described before for lattices.

EXAMPLE

In this example, we generate a codebook $C(\underline{C}_g, \underline{C}_b)$, where $\underline{C}_g$ is the two-dimensional four-state Ungerboeck code based on the four-way partition $Z^2/2Z^2$ and a rate-$\frac{1}{2}$ four-state convolutional encoder. We use a translated version $Z^2 + (\frac{1}{2}, \frac{1}{2})$ of the integer lattice $Z^2$. For coding we use a scaled version of the same code, now based on the lattice partition $\Lambda_b/\Lambda_b' = 2^\beta Z^2 2^{\beta + 1}Z^2$.

Figure 12:
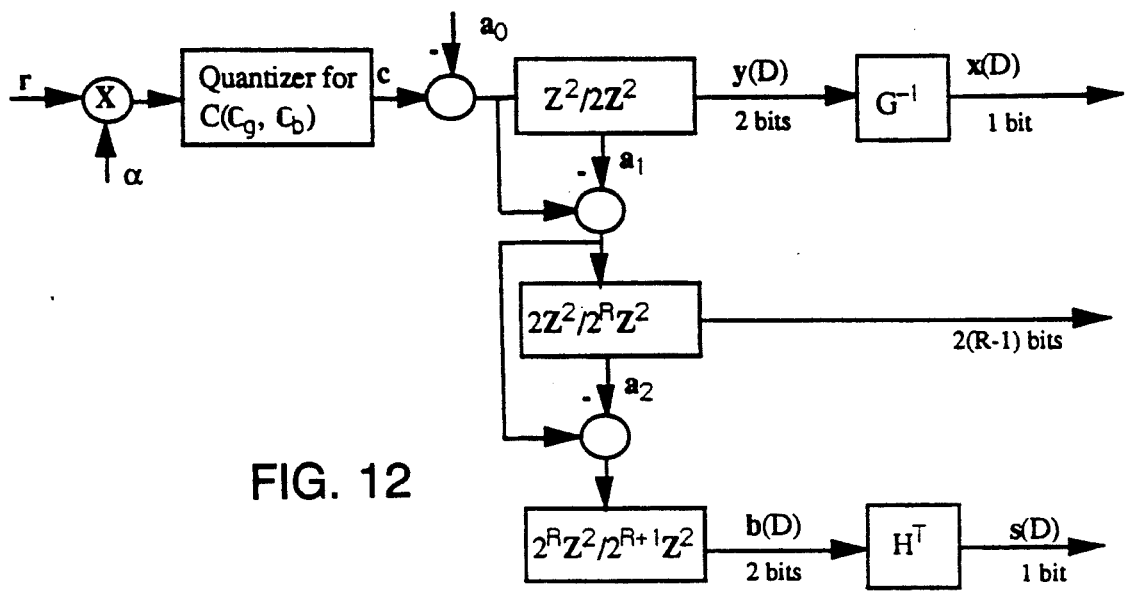
FIG. 12 is a block diagram of a reconstruction circuit for codebook based on the two-dimensional four-state Ungerboeck code.

In the encoder shown in FIG. 12, the source sequence $r(D)$ is decoded with a four-state trellis decoder based on the Viterbi algorithm to the nearest code sequence in the trellis code $\underline{C}_g$. This step includes some means to correct or avoid overloads. The result is a code sequence $c(D) \epsilon C(\underline{C}_g, \underline{C}_b)$.

The two-dimensional elements $c_k$ of the code sequence will lie inside the Voronoi region $\Lambda_b' = 2^{\beta+1} Z^2$ and will take one of $2^{2\beta+2}$ possible values, as was illustrated in FIG. 7 for $\beta = 2$.

The mapping from codeword sequences to bits is linear and simple, and involves the inverse of the generator $G_g$ and the syndrome former matrix $H_b^T$ for the convolutional code $C_b = C_g$.

Figure 13:
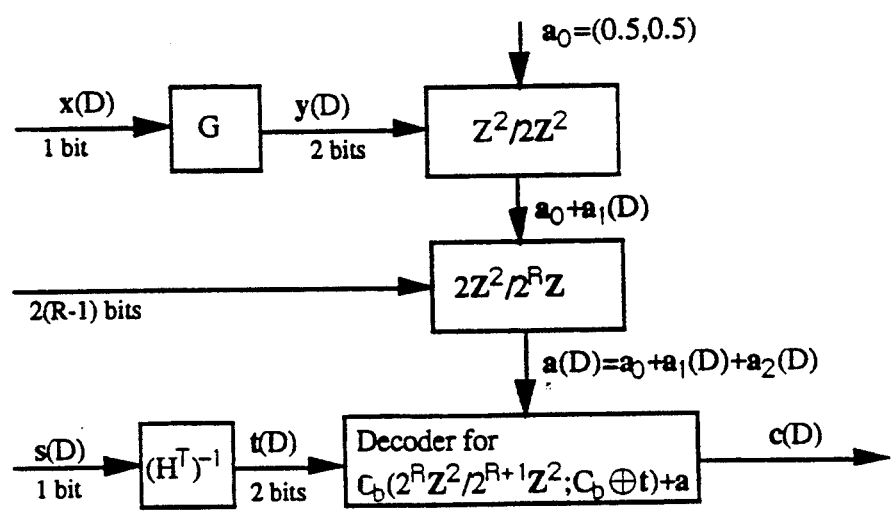
FIG. 13 is a block diagram of a quantizer for codebook based on the two-dimensional four-state Ungerboeck code.

In the decoder shown in FIG. 13, first we determine the label translate $\underline{C}_b(2^\beta Z^2/2^{\beta+1} Z^2; \underline{C}_b' \oplus t(D)) + 2(D)$. Then, a search is performed with the Viterbi algorithm to determine the code sequence $c(D)$.

The two-dimensional four-state Ungerboeck code is a mod-2 trellis code, which is linear. In this case, the label translate $\underline{C}_b(2^\beta Z^2/2^{\beta+1} Z^2; \underline{C}_b' \oplus t(D)) + a(D)$ can be written as a signal-space translate $c'(D) - \underline{C}_b(2^\beta Z^2/2^{\beta+1} Z^2; \underline{C}_b')$, where $c'(D)$ is a coset representative sequence.

The asymptotic coding gain of a four-state two-dimensional Ungerboeck code is 3 dB and its shaping gain is about 1 dB, giving a total of 4 dB improvement over scalar uniform quantization.

Nonuniform quantization with Lattices

According to asymptotic quantization theory, at high rates and fixed dimensionality N, the minimum achievable mean-squared error (MSE) is given by $$MSE = 2^{-2\beta} \gamma_g(N) \| p(r) \|_{N/(N+2)}$$

where $\gamma_g(N)$ is a 'granular' shaping term which has to do with the shape of the granular cells and $\| p(r) \|_\alpha = [\int p(r)^\alpha dr]^{1/\alpha}$ is a 'weighting' term which has to do with adjusting the density of the points according to the probability function $p(r)$. The optimum point density is proportional to $[p(r)]^{N/(N+2)}$, which for $N \gg 2$ is approximately proportional to $p(r)$. Thus to achieve the asymptotic quantization theory limits, the density of the codewords must be varied in proportion to the source probability density. In lattice quantizers, the codeword density is approximately uniform within some boundary region, and therefore these codebooks cannot reach the asymptotic quantization theory limits for low dimensionality and alternative methods are necessary.

Kuhlmann and Bucklew disclosed a piecewise uniform vector quantizer which can be described as follows. Let the source vector r have probability distribution $p(r)$, and assume that $p(r)$ has finite support restricted to some region $\underline{R}$. Then a piecewise uniform vector quantizer can be described by a partition of $\underline{R}$ into M coarse cells, where the i'th coarse cell contains $2^{b_i}$ points from some lattice $\Lambda_i$ such that $$\Sigma_{1 \leq i \leq M} 2^{b_i} = 2^b,$$

where $b = N\beta$ is the number of transmitted bits per N dimensions. In what follows we will restrict our attention to the case where the coarse cells all have the same size. Using well-known results from high-rate quantization theory, the asymptotically optimum allocation of bits to equal-sized cells is given by $$2^{b_i} = 2^b p_i^{N/(N+2)} / \Sigma_{1 \leq j \leq M} p_j^{N/(N+2)}$$

where $p_i = \int_{R_i} p(r) dr$ is the probability mass in the i'th cell. If $p(r)$ is uniform over each coarse cell, then the quantizer described above can asymptotically achieve the minimum MSE, provided the granular cells inside the coarse cells are chosen to obtain the largest possible shaping gain.

If r is not piece-wise uniform, then if the coarse cells can be chosen in a way that $p(r)$ is approximately uniform inside each cell and each cell has sufficiently many points, then approximately optimal performance can be obtained. For a given source distribution, this can be best achieved by choosing the cell boundaries as constant probability contours. This is illustrated in FIG. 14, for a two-dimensional Gaussian source, in which case the contours are simply circles.

However, such a quantizer would be difficult to implement in higher dimensions, because although it is easy to determine in which spherical cell the input vector lies, it is difficult to find the nearest point inside the cell because of the difficulty of quantizing with spherical boundaries.

This problem can be overcome if one uses quasi-spherical regions that are made up of smaller square coarse cells, as shown in FIG. 15, instead of spherical segments as in FIG. 14.

In this case, the regions are not perfectly circular. However, finding the nearest point is straightforward; first we determine in which square coarse cell the received vector lies, which can be done by using a coarse uniform scalar quantizer independently on each coordinate. (The quantizer must also take into account the boundary of the signal set.) Once the cell is determined, the quantization point can be determined using a quantizer for the granular lattice from which the points inside the coarse cell are chosen.

In order to implement a piecewise uniform quantizer in practice, a method is necessary for mapping between the quantization points and bits. In accordance with our invention, we will show that this mapping can be achieved in a simple manner using a prefix code.

We describe this method with an example. Suppose the quantizer shown in FIG. 15 is used to quantize at the rate $b = 12$ bits per two dimensions. There are 121 coarse cells in FIG. 15, which are grouped into eight subregions $R_i$, $1 \leq i \leq 8$, where $R_1$ is the innermost subregion. Within each coarse cell, we choose $2^{b_i}$ points, where $b_i = b - i - 2 = 10 - i$, and i is the index of the subregion in which the coarse cell lies. The coarse cells within $R_i$ are indexed by a prefix code with $b - b_i = i + 2$ bits, as shown in FIG. 16. A signal point is thus addressed by $b - b_i$ bits that specify a coarse cell, and $b_i$ bits that specify the point inside that cell. Since no codeword is a prefix to another, the subregion and granular bits can be separated out the receiver.

Notice that once the coarse cell is determined, its color (subregion) can be obtained from a table with only 121 entries. The inverse map is no more complex.

In this example, we have restricted attention to square coarse cells. The ideas that we presented in earlier sections of this specification can now be applied to allow the use of more general fundamental regions of lattices to form the coarse cells and subregions. This generalization will allow us to generate subregions which can better match certain source statistics.

Consider an N-dimensional lattice partition chain $\Lambda = \Lambda_0 / \Lambda_2 / \ldots / \Lambda_M = \Lambda'$. We form a set of N-dimensional M-point coarse cell centers consisting of the points $s_j$ in $\Lambda'$ that are within the codebook region $\underline{R}$. A minimum mean-squared error decoder for $\Lambda'$ will partition $\underline{R}$ into coarse cells $\underline{R}_v(\Lambda') + s_j$, which are translates of the Voronoi region $\overline{A}_v(\Lambda')$ of $\Lambda'$. These are grouped into subregions $$\underline{R}_i = \cup_{j \in J_i} \underline{R}_v(\Lambda') + s_j, \quad 1 \leq i \leq M,$$

where $\{s_j, j \in J_i\}$ is the set of $|J_i|$ coarse cell centers that fall in $\underline{R}_i$. For each subregion $\underline{R}_i$, we define a codebook $C(\Lambda_i/\overline{\Lambda'})$, based on the lattice partition $\Lambda_i/\Lambda'$, as defined earlier. The elements of this codebook are chosen from the lattice $\Lambda_i$ and the Voronoi region $\underline{R}_v(\Lambda')$ of $\Lambda'$ forms its boundary. Thus, the lattice $\Lambda_i$ determines the granularity in the i'th codebook. More specifically, the number of bits $b_i$ assigned to the i'th codebook is determined by the order of the partition $|\Lambda_i/\Lambda'| = 2^{b_i}$. We again assume that $$\Sigma_{1 \leq i \leq M} |J_i| 2^{b_i} = 2^b.$$

This equation has the form of the Kraft equality for a source in which there are $|J_i|$ inputs of probability $2^{b-b_i}$, $1 \leq i \leq M$, for which it is known that there exists a prefix code with $|J_i|$ words of length $b - b_i$ bits, $1 \leq i \leq M$, which can be used to specify the cell centers.

The encoding operation follows the principles described in the earlier sections and is shown in FIG. 17.

The incoming source vector r is first decoded with a decoder that selects the closest element $s_j$ in the coarse lattice $\Lambda'$. The signal point $s_j$ identifies the subregion $\underline{R}_i$ and thus the granular lattice $\Lambda_i$. By subtracting $s_j$ from r, the input vector is translated to the Voronoi region $\underline{R}_v(\Lambda')$, and can then be quantized using a quantizer for the codebook $C(\Lambda_i/\Lambda')$. The first step in this granular quantization is to find the nearest point in the lattice $\Lambda_i$, and this can be accomplished using known lattice decoding algorithms (if $\Lambda_i$ is a rectangular lattice, this step is particularly simple).

Even though the error vector e lies inside the Voronoi region $\underline{R}_v(\Lambda')$, occasionally quantization may pull the quantized point outside. However, this situation can be corrected by reducing the coordinates of the quantized vector that resulted in a large quantization error.

Once the quantized vector c is inside the Voronoi region, the mapping to $b_i$ bits can be accomplished in the manner described in Section III. A further table look-up step will produce the index for the coarse cell center $s_j$ according to a variable-length prefix code as described earlier, and these together will form the b bits which are transmitted.

In the receiver, the incoming bits are first decoded by a prefix decoder to separate the granular bits from those that identify $s_j$. The granular bits are decoded as in section III to produce the codeword c, which when added to the cell center $s_j$ will give the reconstructed signal $s_j + c$.

Similar principles can be applied to construct nonuniform quantizers whose coarse cells are codebooks whose boundaries are based on subregions of lower-dimensional regions and finite field codes or codebooks based on trellis codes and trellis-structured boundaries. The key difference in these extensions will be to define the same cells first in label space and then in signal space.

Other embodiments are within the following claims.

We claim:

1. Apparatus for quantizing signal vectors whose components represent signal samples, comprising means for providing a codebook having codewords based on a coset code, and which lie inside a boundary region which is based on another coset code, said boundary region being other than an N-cube and other than the Voronoi region of a sublattice $\Lambda_b = M \Lambda_g$ of a lattice $\Lambda_g$ upon which said codewords may have been based, M being a scaling factor, and means for selecting codewords from said codebook as quantized values representing said signal vectors.

2. The apparatus of claim 1 wherein said codeword as based on said lattice $\Lambda_g$, or a translate $\Lambda_g + a$ of said lattice $\Lambda_g$.

3. The apparatus of claim 1 wherein said codewords are based on a trellis code or a translate of a trellis code.

4. The apparatus of claim 1 wherein said boundary region is based on a lattice.

5. The apparatus of claim 1 wherein said boundary region is based on a trellis code.

6. The apparatus of claim 1 wherein said codeword are fundamental regions of a lattice $\Lambda_g$ or a translate or said lattice $\Lambda_g$.

7. The apparatus of claim 6 wherein said fundamental regions are Voronoi regions.

8. The apparatus of claim 1 wherein said codewords are fundamental regions of a trellis code or a translate of a trellis code.

9. The apparatus of claim 8 wherein said fundamental regions are Voronoi regions.

10. The apparatus of claim 1 wherein said boundary region is a fundamental region of a lattice $\Lambda_b$.

11. The apparatus of claim 10 wherein said fundamental region is a Voronoi region.

12. The apparatus of claim 1 wherein said boundary region is a fundamental region of a trellis code.

13. The apparatus of claim 12 wherein said fundamental region is a Voronoi region.

14. The apparatus of claim 1 further comprising a quantizer for selecting one of said codewords to represent each vector.

15. The apparatus of claim 14 wherein said quantizer includes means for detecting an overload.

16. The apparatus of claim 15 wherein said means includes a decoder for said coset code on which said boundary region is based to determine said overload.

17. The apparatus of claim 16 further comprising a second quantizer for quantizing said vector when an overload is detected.

18. The apparatus of claim 17 wherein said second quantizer is a scalar quantizer.

19. The apparatus of claim 17 further comprising means for inserting an extra bit to identify the quantizer.

20. The apparatus of claim 1 wherein each said codeword comprises a fundamental region of said lattice $\Lambda_g$, and lies within a fundamental region of said sublattice $\Lambda_b$.

21. The apparatus of claim 20 further comprising a quantizer for selecting one of said codewords to represent each said vector.

22. The apparatus of claim 20 wherein each said codeword is represented by a coset leader of said sublattice $\Lambda_b$ in $\Lambda_g$ or a translate of $\Lambda_g$.

23. The apparatus of claim 22 further comprising a mapper for representing said coset leader by bits.

24. The apparatus of claim 23 further comprising a binary decoder $G_g$ for the lattice $\Lambda_g$ and a binary syndrome former $H_b^T$ for the sublattice $\Lambda_b$.

25. The apparatus of claim 23 further comprising a reconstructor for mapping said bits into a coset representative, and for translating said coset representative to said coset leader using a decoder for the sublattice $\Lambda_b$.

26. The apparatus of claim 25 wherein said decoder is a minimum distance decoder for the sublattice $\Lambda_b$.

27. The apparatus of claim 25 wherein said mapping of bits to coset representatives includes a binary encoder $G_g$ for the lattice $\Lambda_g$ and an inverse syndrome former $(H_b^{-1})^T$ for the sublattice $\Lambda_b$.

28. The apparatus of claim 1 wherein said codewords are based on a trellis code $\underline{C_g}(\Lambda_g/\Lambda_g'; C_g)$ which comprises sequences whose elements lie in a sequence of cosets of $\Lambda_g'$ in $\Lambda_g$ of a translate $\Lambda_g + a$ of $\Lambda_g$ selected by the convolutional code $C_g$.

29. The apparatus of claim 1 wherein said boundary region is based on a trellis code $\underline{C_b}(\Lambda_b/\Lambda_b'; C_b)$ which comprises sequences whose elements lie in a sequence of cosets of $\Lambda_b'$ in $\Lambda_b$ of a translate $\Lambda_b + a$ of $\Lambda_b$ selected by the convolutional code $C_b$.

30. The apparatus of claim 28 or 29 further comprising a quantizer for selecting one of said codewords in said boundary region.

31. The apparatus of claim 30 wherein said quantizer includes means for detecting an overload.

32. The apparatus of claim 31 further comprising a second quantizer for quantizing said vector when an overload is detected.

33. The apparatus of claim 32 wherein said second quantizer is a scalar quantizer.

34. The apparatus of claim 32 further comprising means for inserting an extra bit to identify the quantizer.

35. The apparatus of claim 31 wherein said means includes a decoder for said trellis code $\underline{C_b}$.

36. The apparatus of claim 30 further comprising a mapper for representing said selected codeword by bits.

37. The apparatus of claim 36 wherein said mapper further comprises an inverse syndrome former $(H_b^{-1})^T$ for the convolutional code $C_b$.

38. The apparatus of claim 30 further comprising a decoder $G_g^{-1}$ for the convolutional code $C_g$ and a syndrome former $H_b^T$ for the convolutional code $C_b$.

39. The apparatus of claim 30 further comprising a reconstructor for mapping said bits to code sequences.

40. The apparatus of claim 39 further comprising means for mapping boundary bits to coset representatives for said convolutional code $C_b$ to identify a label translate of said trellis code $\underline{C_b}$.

41. The apparatus of claim 40 wherein said a decoder of said label translate of said trellis code $\underline{C_b}$ determines said code sequence.

42. The apparatus of claim 40 further comprising means for mapping granular and scaling bits to identify a signal space translate of said label translate of said trellis code $\underline{C_b}$.

43. The apparatus of claim 40 wherein said mapper of said granular bits comprises an encoder $G_g$ for the convolutional code $\underline{C_g}$.

44. The apparatus of claim 1 further comprising multiple said codebooks forming a super codebook, at least two of said codebooks having codewords with different volumes.

45. The apparatus of claim 44 further comprising means for selecting one of said codebooks and one of said codewords in said selected codebook to represent said vector.

46. The apparatus of claim 44 further comprising means for representing said selected codebook and said selected codeword by bits.

47. The apparatus of claim 46 further comprising means to represent the selected codebook as a variable length prefix code so that a fixed number of bits can be used to represent the combination of the selected codebook and the codeword.

48. The apparatus of claim 46 further comprising a reconstructor to determine from said bits a codebook and a codeword.

49. The apparatus of claim 48 further comprising a decoder for the prefix code.

50. The apparatus of claim 44 wherein said multiple codebooks are translates of one another either in label space or in signal space.

51. Apparatus for quantizing signal vectors whose components represent signal samples, comprising
  means for providing a codebook having codewords based on a coset code and which lie inside a boundary region which is based on a finite field code and a finite set of subregions, said boundary region being other than an N-cube and other than the Voronoi region of a sublattice $\Lambda_b = M\Lambda_g$ of a lattice $\Lambda_g$ upon which said codewords may have been based, M being a scaling factor, and
  means for selecting code words from said codebook as quantized values representing said signal vectors.

52. The apparatus of claim 51 further comprising means for selecting one of said codewords to represent each said vector.

53. The apparatus of claim 52 further comprising a mapper for representing said codewords by bits.

54. The apparatus of claim 53 wherein said mapper further comprises means for extracting a label representing a sequence of subregions.

55. The apparatus of claim 54 wherein said mapper further comprises a binary encoder $\gamma_g^{-1}$ for said coset code upon which said codewords are based and the syndrome former $H_b^T$ for the said finite field code.

56. The apparatus of claim 54 further comprising a reconstructor for mapping said bits into codeword using a decoder for said finite field code.

57. The apparatus of claim 56 wherein said reconstructor further comprises a mapper for mapping boundary bits to a coset representative of the finite field code, said decoder selecting an element from the coset of the finite field code identified by the coset representative, said element subsequently selecting the sequence of subregions.

58. The apparatus of claim 56 wherein said decoder also uses granular and scaling bits to select said element.

59. The apparatus of claim 56 wherein said mapper further comprises a binary encoder $G_g$ for said coset code upon which said codewords are based, and in inverse syndrome former $(H_b^{-1})^T$ for said finite field code.

60. Apparatus for quantizing signal vectors comprising multiple codebooks forming a super codebook, at least two of said codebooks having different densities of codewords, the apparatus further comprising means for selecting one of said codebooks and one of said codewords in said selected codebook to represent said vector, the apparatus further comprising means for representing said selected codebook and said selected codeword by bits, and further comprising means for representing the selected codebook as a variable length prefix code to represent the selected codebook so that a fixed number of bits can be used to represent the combination of the selected codebook and the codeword.

61. The apparatus of claim 60 further comprising a reconstructor to determine from said bits a codebook and a codeword.

62. The apparatus of claim 61 further comprising a decoder for the prefix code.

63. A method for quantizing signal vectors whose components represent signal samples, comprising providing a codebook having codewords based on a coset code, and which lie inside a boundary region which is based on another coset code, said boundary region being other than an N-cute and other than the Voronoi region of a sublattice $\Lambda_b = M\Lambda_g$ of a lattice $\Lambda_g$ upon which said codewords may have been based, M being a scaling factor, and selecting codewords from said codebook as quantized values representing said signal vectors using said codebook.

64. A method for quantizing signal vectors whose components represent signal samples, comprising providing a codebook having codewords based on a coset code, and which lie inside a boundary region which is based on a finite field code and a finite set of subregions, said boundary region being other than an N-cube and other than the Voronoi region of a sublattice $\Lambda_b = M\Lambda_g$ of a lattice $\Lambda_g$ upon which said codewords may have been based, M being scaling factor, and selecting codewords from said codebook as quantized values representing said signal vectors using said codebook.

65. A method for quantizing signal vectors comprising providing multiple codebooks forming a super codebook, at least two of said codebooks having codewords with different volumes, selecting one of said codebooks and one of said codewords in said selected codebook to represent said vector, representing said selected codebook and said selected codeword by bits, and providing a variable length prefix code to represent the selected codebook so that a fixed number of bits can be used to represent the combination of the selected codebook and the codeword.

* * * * *